United States Patent
Cho et al.

(10) Patent No.: US 8,116,117 B2
(45) Date of Patent: Feb. 14, 2012

(54) METHOD OF DRIVING MULTI-LEVEL VARIABLE RESISTIVE MEMORY DEVICE AND MULTI-LEVEL VARIABLE RESISTIVE MEMORY DEVICE

(75) Inventors: Woo-Yeong Cho, Suwon-si (KR); Ki-Sung Kim, Seoul (KR); Du-Eung Kim, Yongin-si (KR); Kwang-Jin Lee, Hwaseong-si (KR); Jun-Soo Bae, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 9 days.

(21) Appl. No.: 12/632,018

(22) Filed: Dec. 7, 2009

(65) Prior Publication Data

US 2010/0085799 A1 Apr. 8, 2010

Related U.S. Application Data

(63) Continuation-in-part of application No. 11/855,525, filed on Sep. 14, 2007, now Pat. No. 7,639,522.

(30) Foreign Application Priority Data

Nov. 29, 2006 (KR) .......................... 10-2006-0119148

(51) Int. Cl.
*G11C 11/00* (2006.01)
(52) U.S. Cl. ........................................ 365/148; 365/163
(58) Field of Classification Search .................. 365/148, 365/158, 163, 171, 173
See application file for complete search history.

(56) References Cited

U.S. PATENT DOCUMENTS

| | | | |
|---|---|---|---|
| 6,314,014 B1 * | 11/2001 | Lowrey et al. | 365/100 |
| 6,862,213 B2 | 3/2005 | Hamaguchi | |
| 6,882,567 B1 * | 4/2005 | Wong | 365/185.03 |
| 6,958,934 B2 | 10/2005 | Fan et al. | |
| 6,961,267 B1 | 11/2005 | Fastow et al. | |
| 7,397,704 B2 * | 7/2008 | Sim | 365/185.22 |
| 7,440,314 B2 * | 10/2008 | Sakimura et al. | 365/158 |
| 2004/0130938 A1 | 7/2004 | Hamaguchi | |
| 2004/0228163 A1 | 11/2004 | Khouri et al. | |
| 2006/0166455 A1 | 7/2006 | Gordon et al. | |
| 2006/0285392 A1 | 12/2006 | Incarnati et al. | |

FOREIGN PATENT DOCUMENTS

CN 1499526 A 5/2004
(Continued)

OTHER PUBLICATIONS

Office Action dated Aug. 1, 2011 from counterpart Chinese Patent Application No. 200710196653.1 with English translation.

*Primary Examiner* — Tuan T Nguyen
*Assistant Examiner* — Lance Reidlinger
(74) *Attorney, Agent, or Firm* — Volentine & Whitt, PLLC

(57) ABSTRACT

Disclosed is a method of driving a multi-level variable resistive memory device. A method of driving a multi-level variable resistive memory device includes supplying a write current to a variable resistive memory cell so as to change resistance of the variable resistive memory cell, verifying whether or not changed resistance enters a predetermined resistance window, the intended resistance window depending on the resistance of reference cells, and supplying a write current having an increased or decreased amount from the write current supplied most recently on the basis of the verification result so as to change resistance of the variable resistive memory cell.

15 Claims, 34 Drawing Sheets

FOREIGN PATENT DOCUMENTS

| | | | |
|---|---|---|---|
| EP | 1729303 A1 | 12/2006 | |
| JP | 10083686 A | 3/1998 | |
| JP | 2004158143 A | 6/2004 | |
| KR | 1020030048881 A | 6/2003 | |
| KR | 1020060030171 A | 4/2006 | |
| WO | WO 2005086170 A1 * | 9/2005 | |

* cited by examiner

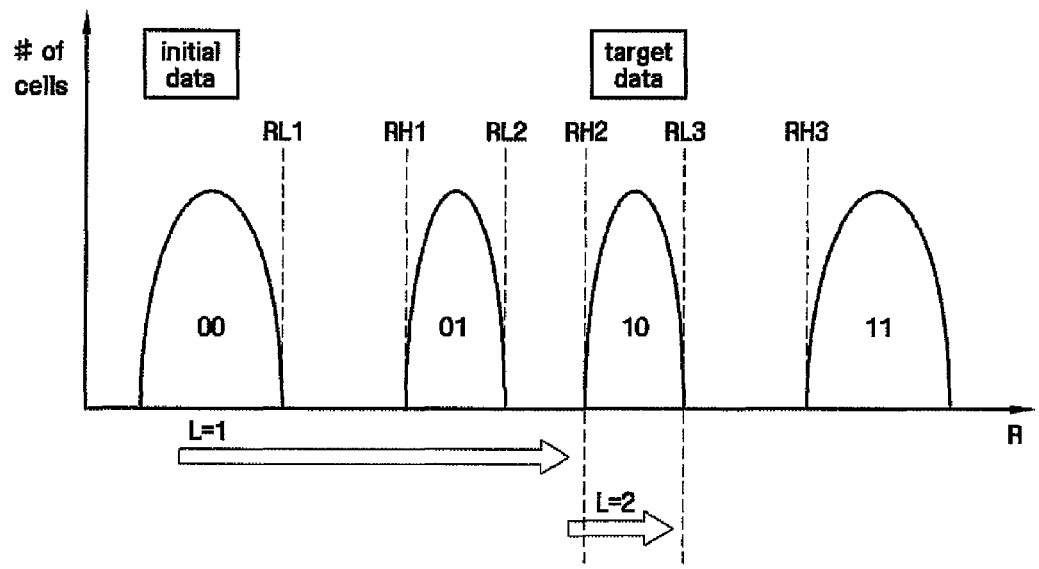
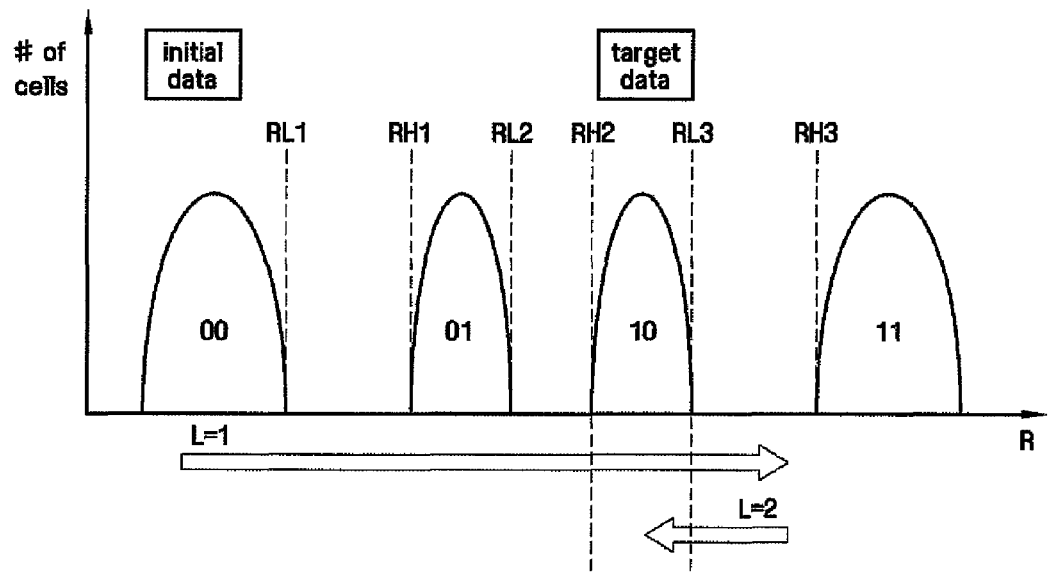

METHOD OF DRIVING MULTI-LEVEL VARIABLE RESISTIVE MEMORY DEVICE AND MULTI-LEVEL VARIABLE RESISTIVE MEMORY DEVICE

CROSS REFERENCE TO RELATED APPLICATION

This application is a continuation-in-part application of U.S. application Ser. No. 11/855,525, filed Sep. 14, 2007, which claims priority from Korean Patent Application No. 10-2006-0119148 filed on Nov. 29, 2006, the subject matter of which is hereby incorporated by reference.

BACKGROUND

1. Field

The present invention relates to a method of driving a multi-level variable resistive memory device and a multi-level variable resistive memory device.

2. Description of the Related Art

Memory devices using resistance materials to store data in a non-volatile manner include; phase change random access memory (PRAM), resistive RAM (RRAM), and ferroelectric RAM (FRAM). In contrast, dynamic RAM (DRAM) and contemporary flash memory store data using electrical charge to store data, although DRAM is not nonvolatile in its operating nature. Instead of variations in electrical charge non-volatile memory devices using resistance materials store data in relation to change of a phase state change for a material like a chalcogenide alloy (PRAM), change in resistance of variable resistance materials (RRAM), and change in a polarization phenomenon of ferroelectric materials (FRAM).

Contemporary memory devices regardless of data storage mechanism, are characterized by continuing attempts to shrink memory cell size, increase integration density, and/or increase data storage density per unit area occupied by the memory device. Among other techniques used to increase data storage density, memory cells capable of storing multiple data bits are increasingly common.

SUMMARY

In one embodiment, the invention provides a method of driving a write data value to a multi-level variable resistive memory device, the method comprising; reading resistance of reference cells, applying a write current to a variable resistive memory cell to change the actual resistance of the variable resistive memory cell, verifying whether the actual resistance resides in an intended resistance window associated with the write data value and generating verification results, the intended resistance window depending on the resistance of the reference cells, and varying the amount of the write current in accordance with the verification results, and then re-applying the write current to the variable resistive memory cell.

In another embodiment, the invention provides a multi-level variable resistive memory device, comprising; a memory cell array including a variable resistive memory cell, a temperature compensation circuit comprising one or more reference cells and reading resistance of the reference cells, a verification sense amplifier verifying whether the actual resistance of the variable resistive memory cell resides in an intended resistance window and generating verification results, the intended resistance window depending on the resistance of the reference cells, a write control circuit supplying a control signal to increase or decrease the amount of write current applied to the variable resistive memory cell on the basis of the verification results, and a write driver supplying the write current to the variable resistive memory cell, and increasing or decreasing the amount of the write current in response to the control signal.

In another embodiment, the invention provides a memory system comprising, a multi-level variable resistive memory device; and a memory controller accessing the variable resistive memory device in response to an external command, wherein the variable resistance memory device comprises: a memory cell array including a variable resistive memory cell; a temperature compensation circuit comprising one or more reference cells and reading resistance of the reference cells; a verification sense amplifier verifying whether the actual resistance of the variable resistive memory cell resides in an intended resistance window and generating verification results, the intended resistance window depending on the resistance of the reference cells; a write control circuit supplying a control signal to increase or decrease the amount of write current applied to the variable resistive memory cell on the basis of the verification results; and a write driver supplying the write current to the variable resistive memory cell, and increasing or decreasing the amount of the write current in response to the control signal.

BRIEF DESCRIPTION OF THE DRAWINGS

Embodiments of the invention will be described with reference to the attached drawings in which:

FIGS. 4 to 6 are graphs illustrating the method of driving a multi-level phase change random access memory device according to the embodiment of the present invention;

DESCRIPTION OF EMBODIMENTS

Figure 1:
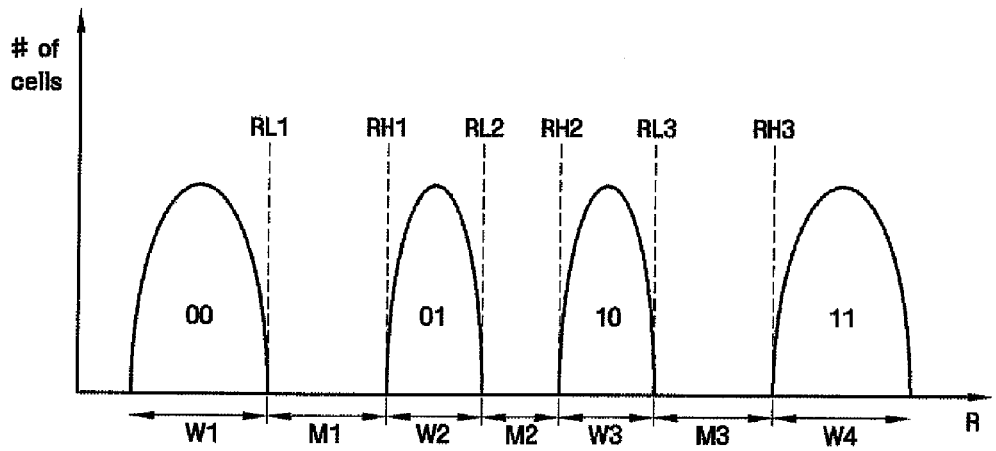
FIG. 1 is a graph illustrating a resistance window of a multi-level phase change random access memory device according to an embodiment of the present invention.

Advantages and features of the present invention and methods of accomplishing the same may be understood more readily by reference to the following detailed description of embodiments with reference to the accompanying drawings. The present invention may, however, be embodied in many different forms and should not be construed as being limited to only the illustrated embodiments. Rather, these embodiments are presented as teaching examples. Throughout the written description and drawings, like reference numerals refer to like or similar elements.

Hereinafter, embodiments of the invention will be described using a phase change random access memory device (PRAM) example. However, it will be apparent to those skilled in the art that other embodiments of the invention may be applied to others forms of nonvolatile memory using resistance materials, such as a resistive RAM (RRAM), and a ferroelectric RAM (FRAM).

FIG. 1 is a graph illustrating a series of resistance window for a multi-level PRAM according to an embodiment of the invention. In FIG. 1, the exemplary PRAM is assumed to store two bits of data. However, it will be apparent to those skilled in the art that a memory cell storing three or more bits might be used equally well as an example.

Referring to FIG. 1, the multi-level PRAM has four resistance windows W1, W2, W3, and W4. A first resistance window W1 is characterized by a lowest resistance level and a fourth resistance window W4 is characterized by a highest resistance level with a second resistance window W2 and a third resistance window W3 being sequentially intermediate thereto. As shown in FIG. 1, the first resistance window W1 is defined as being less than a first reference resistance RL1. The second resistance window W2 is defined as being greater than a second reference resistance RH1 and less than a third reference resistance RL2. The third resistance window W3 is defined as being greater than a fourth reference resistance RH2 and less than a fifth reference resistance RL3. The fourth resistance window W4 is defined as being greater than a sixth reference resistance RH3. The separate four resistance windows W1, W2, W3, and W4 are ascribed to respective two-bit data states 00, 01, 10, and 11.

Resistance margins M1, M2, and M3 are respectively disposed between the four resistance windows W1, W2, W3, and W4. In particular, a first resistance margin M1 separates the first resistance window W1 from the second resistance window W2. A second resistance margin M2 separates the second resistance window W2 from the third resistance window W3, and the third resistance margin M3 separates the third resistance window W3 from the fourth resistance window W4.

Figure 2:
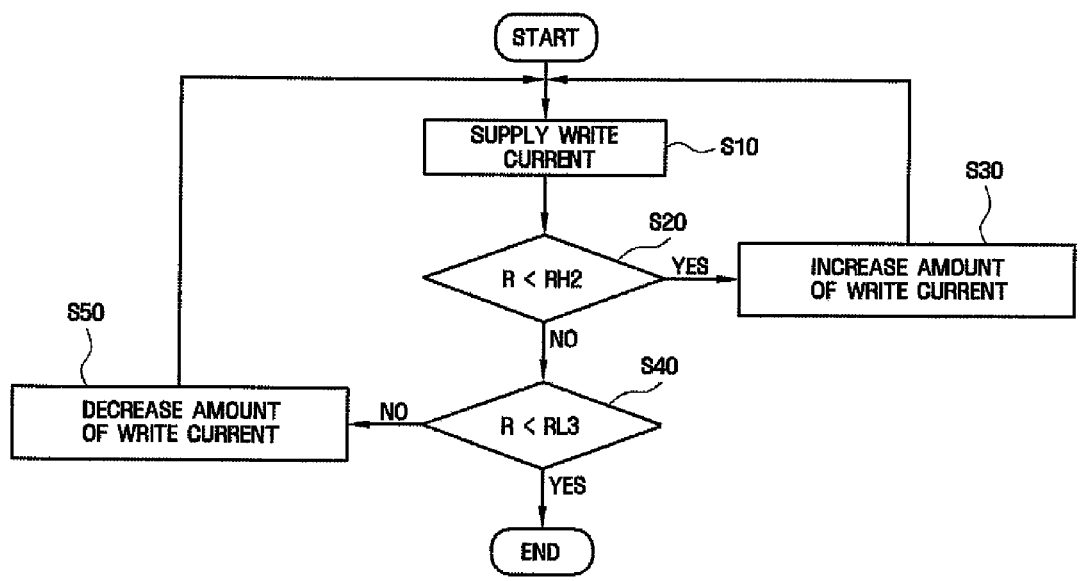
FIG. 2 is a flowchart illustrating a method of driving a multi-level phase change random access memory device according to an embodiment of the present invention.

FIG. 2 is a flowchart illustrating a method of driving a multi-level PRAM according to the embodiment of the invention. The term "driving" in this context refers to the process(es) by which a memory cell in the multi-level PRAM is ascribed a particular resistance value.

Referring to FIG. 2, a write-verification operation is used when two-bit data is written in the memory cell of the multi-level PRAM. That is, a method of writing two-bit data in a particular memory cell includes; supplying a predetermined write current to the memory cell, verifying whether or not the proper data value has been written (i.e., whether the memory cell exhibits the appropriate resistance state for the data intended to be written to the memory cell), and in view of the verification results increasing or decreasing the applied write current.

The example of FIG. 2 assumes that a data value of 10 is to be written to the memory cell. However, other data values might be used as alternate examples.

Initially, write current is supplied to the phase change memory cell in order to change the resistance R exhibited by the phase change memory cell (S10). The write current applied to the phase change memory cell may be set to a constant level. Alternately, a sequentially increasing or decreasing stepped current may be applied. Alternately, an increasing then decreasing or deceasing then increasing current may be applied. Thus, the present invention is not limited to any particular form of applied write current.

Following the initial application of the write current, one or more a data verification operation(s) is performed to determine whether the actual resistance R exhibited by the phase change memory cell corresponds to a resistance window properly indicating the write data (e.g., "10" in the illustrated example which corresponds to resistance window W3) (S20 and S40).

Figure 3A:
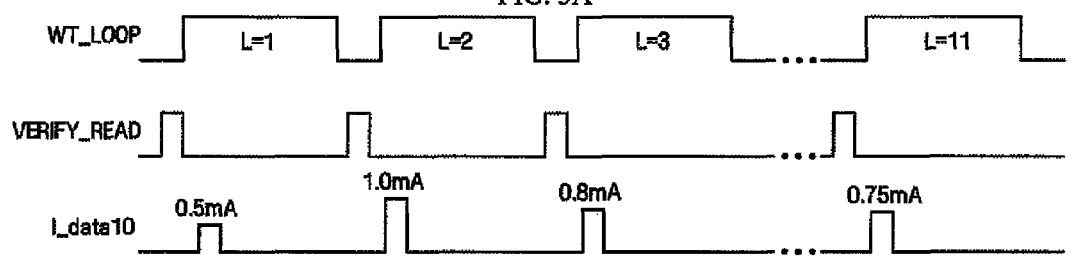
FIGS. 3A and 3B are conceptual timing charts illustrating the method of driving a multi-level phase change random access memory device according to the embodiment of the present invention.
Figure 3B:
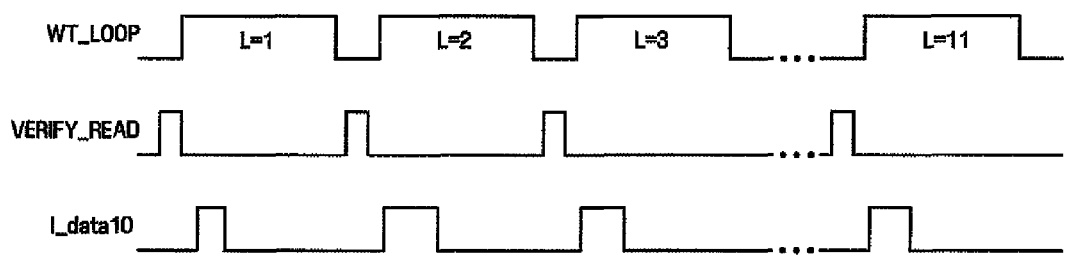

That is, actual resistance R of the phase change memory cell is compared with the fourth reference resistor RH2 (S20). If the actual resistance R exhibited by the phase change memory cell is less than fourth reference resistance RH2, the level of the applied write current should be increased (S30) to increase the resistance R of the phase change memory cell. Application of write current (S10) and comparison of actual resistance R to the fourth reference resistance RH2 (S30) continues until the actual resistance is greater than the fourth reference resistance RH2. Exemplary methods of applying an increased write current within this control loop are illustrated in FIGS. 3A and 3B.

Once the actual resistance R of the phase change memory cell is determined to be greater than the fourth reference resistance RH2 (S20=no), it is compared to the fifth reference resistance RL3 (S40).

If the actual resistance R of the phase change memory cell is greater than the fifth reference resistance RL3, it should be decreased. This may be accomplished by applying a reduced write current to the phase change memory cell (S50). Application of write current (S10) and comparison of actual resistance R to the fifth reference resistance RL3 (S50) continues until the actual resistance is less than the fifth reference resistance RL3. Exemplary methods of applying a decreased write current useful within this control loop are illustrated in FIGS. 3A and 3B.

Once the actual resistance R exhibited by the phase change memory cell enters resistance window W3 and properly corresponds to a data value of 10 using the above-described methods, application of the write current to the phase change memory cell is topped and the write operation ends.

FIGS. 3A and 3B are conceptual timing charts illustrating exemplary methods of driving a multi-level PRAM designed in accordance with an embodiment of the invention.

Referring to FIGS. 3A and 3B, the multi-level PRAM according to an embodiment of the invention writes data during a plurality of write loops L=1 through 11. Before each write loop begins, a verification operation (VERIFY READ) is performed. During each write loop, data may be written to the phase change memory cell.

In FIG. 3A, the amplitude of an applied write current (I_data10) adapted to write a data value of 10 will vary in accordance with the results of the verification operation. For example, a first applied write current having an amplitude of 0.5 mA is supplied during the first write loop L=1. The following verification result shows that the actual resistance R of the phase change memory cell has not entered the intended resistance window W3 corresponding to a data value of 10. Thus, a write current having an amplitude of 1.0 mA is applied to the phase change memory cell during the second write loop L=2.

In contrast and as shown in FIG. 3B, the pulse width of an applied write current (I_data10) adapted to write a data value of 10 varies in accordance to the verification result. For example, if the actual resistance R exhibited by the phase change memory cell does not enter the intended resistance window W3 corresponding to a data value of 10 in response to the application of an initial write current supplied during the first write loop L=1, the pulse width of the write current applied during the second write loop L=2 is increased over the pulse width of the initial write current supplied during the first write loop L=1.

As shown in FIGS. 2, 3A, and 3B, according to an embodiment of the invention, the amount of the write current (I_data10) may vary over a series of write loops L=1 to 11. Within the illustrated embodiments, the term "amount" as used to characterize the applied write current indicates a particular quantity of electrical charge supplied by the write current. This supplied quantity of electrical charge may be varied, for example, by increasing the amplitude of the write current or the applied period of the write current.

Thus, if the actual resistance R of the phase change memory cell is less than the fourth reference resistance RH2, the amount of the write current increases and, if the actual resistance R of the phase change memory cell is greater than the fifth reference resistance RL3, the amount of the write current decreases. Of course, according to the flowchart of FIG. 2, as each of the write loops L=1 to 11 progresses, the amount of the write current may continuously increase or decrease. As described above in relation to the illustrated embodiment, since actual resistance R of the phase change memory cell can be controlled to place it within an intended resistance window W3, it is possible to improve reliability of the write operation. Further, since it is possible to ensure sufficient resistance margins M2 and M3 in the working example, it is possible to minimize read errors associated with the stored data.

Figure 6:
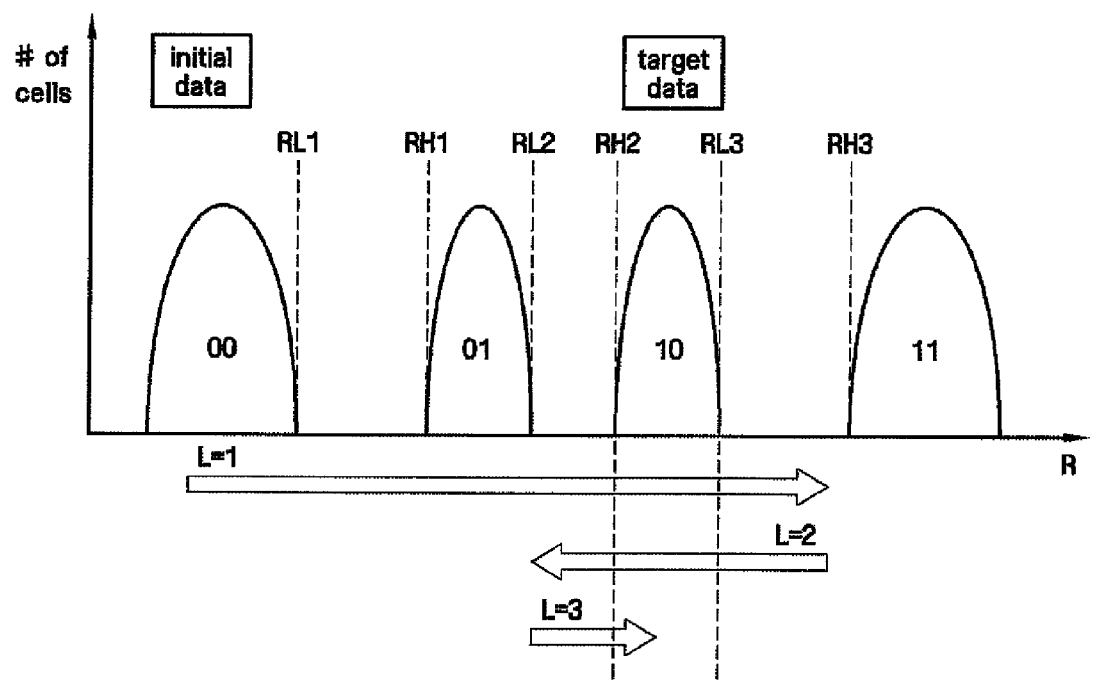

FIGS. 4, 5 and 6 are graphs illustrating exemplary methods for driving a multi-level PRAM according to embodiments of the invention. FIGS. 4, 5 and 6 show a case where a write data value of 10 is written to a phase change memory cell currently exhibiting an actual resistance R indicating a data value of 00. That is, the initial data is 00 and the target data is 10. FIGS. 4 5, and 6 show examples of variations in the actual resistance R of the phase change memory cell through a number of write loops. These are, however, merely selected examples further illustrating embodiments of the invention. The arrows shown in FIGS. 4, 5 and 6 indicate respective changes in the actual resistance R exhibited by the phase change memory cell having the target data 10 written to each through a series of write loops.

Referring to FIG. 4, the actual resistance R of the phase change memory cell is increased by a write current supplied during a first write loop L=1. However, since the actual resistance R of the phase change memory cell is still less than the fourth reference resistance RH2, the amount of the write current is increased and then the increased write current is again supplied during the second write loop L=2. As the verification results show, since the actual resistance R of the phase change memory cell following the second write loop L=2 resides in the intended resistance window corresponding to a data value of 10, the write operation ends.

Referring to FIG. 5, the actual resistance of the phase change memory cell is increased by a write current supplied during the first write loop L=1. However, since the actual resistance of the phase change memory cell becomes greater than the fifth reference resistance RL3, the amount of the write current is decreased and then the decreased write current is supplied during a second write loop L=2. As the verification results show, since the actual resistance of the phase change memory cell following the second write loop L=2 resides in the intended resistance window corresponding to a data value of 10, the write operation ends.

Referring to FIG. 6, the actual resistance of the phase change memory cell is increased by a write current supplied during a first write loop L=1. However, since the actual resistance of the phase change memory cell is greater than the fifth reference resistance RL3, the amount of the write current must be decreased during a second write loop L=2. However, the verification results show that following the second write loop L=2, the actual resistance of the phase change memory cell is now less than the fourth reference resistance RH2. Hence, the amount of the write current must be increased and supplied during a third write loop L=3. Following the third write loop L=3, the verification results show that the actual resistance of the phase change memory cell reside in the intended resistance window corresponding to a data value of 10, and the write operation ends.

In particular and as illustrated in FIGS. 3A and 3B, the amount of the write current applied during the third write loop L=3 should be greater than the amount of write current applied during the second write loop L=2, but less than the amount of write current applied during the first write loop. Therefore, as shown in FIG. 6, it can be seen that the magnitude of change in the actual resistance of the phase change memory cell following the third write loop is less than the magnitude of change in actual resistance of the phase change memory cell following the second write loop. Thus, in a multi-level PRAM according to an embodiment of the invention, the step increase or decrease in the amount of applied write current may be reduced over a series of write loops.

Figure 7:
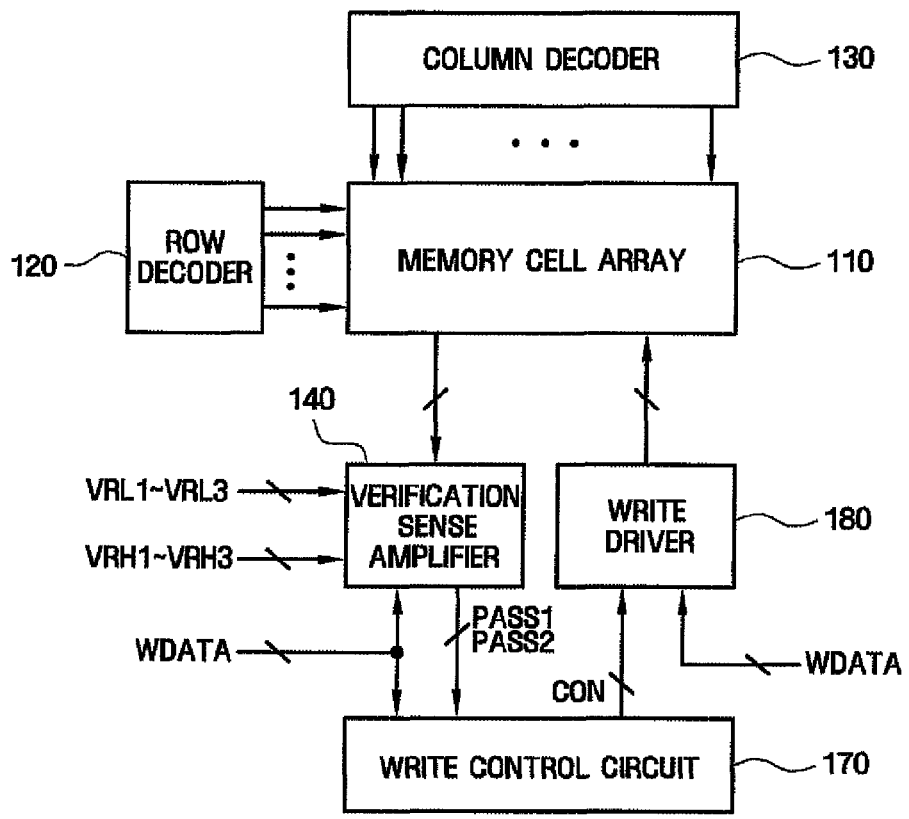
FIG. 7 is a block diagram showing a multi-level phase change random access memory device according to the embodiment of the present invention.

FIG. 7 is an exemplary block diagram showing a multi-level PRAM according to an embodiment of the invention, and capable of implementing the above-described or similar driving methods.

Referring to FIG. 7, the multi-level PRAM generally includes a memory cell array 110, a row decoder 120, a column decoder 130, a verification sense amplifier 140, a write control circuit 170, and a write driver 180.

The memory cell array 110 includes a plurality of phase change memory cells divided into a plurality of cell groups. Though not shown in FIG. 7, the phase change memory cell includes a variable resistance element that includes a phase change material having at least two different resistance values according to a crystal status or an amorphous status, and an access element that controls a current flowing to the variable resistance element. Here, the access element may be a diode or a transistor connected to the resistance element in series. Further, as the phase change material, various materials, such as, GaSb, InSb, InSe, Sb2Te3, and GeTe containing two atoms, GeSbTe, GaSeTe, InSbTe, SnSb2Te4, and InSbGe containing three atoms, and AgInSbTe, (GeSn)SbTe, GeSb (SeTe), and Te81Ge15Sb2S2 containing four atoms may be used.

The row decoder 120 receives and decodes a row address and designates a row of the plurality of phase change memory cells to be written. The column decoder 130 receives and decodes a column address and designates a column of the plurality of phase change memory cells to be written.

The verification sense amplifier 140 verifies whether or not resistance of the phase change memory cell enters a predetermined resistance window.

Specifically, the verification sense amplifier 140 receives first to sixth reference voltages VRL1 to VRL3 and VRH1 to VRH3 corresponding to first to sixth reference resistances RL1 to RL3 and RH1 to RH3, respectively, and receives write data (WDATA) to be written in the phase change memory cell. The reference voltage to be used for sensing is selected among the first to sixth reference voltages VRL1 to VRL3 and VRH1 to VRH3 on the basis of the write data WDATA. For example, in a case where the write data WDATA to be written is 10, since the resistance window corresponding to the data 10 is greater than fourth reference resistance RH2 and less than fifth reference resistance RL3, the reference voltages to be used for sensing are the fourth reference voltage VRH2 corresponding to fourth reference resistance RH2 and the fifth reference voltage VRL3 corresponding to fifth reference resistance RL3. For another example, in a case where the write data WDATA to be written is 01, the reference voltages to be used for sensing are the second reference voltage VRH1 and the third reference voltage VRL2. With the selected reference voltages, it is determined whether the actual resistance of the phase change memory cell resides in the intended resistance window. As the determination result, first and/or second comparison signals PASS1 and PASS2 are supplied to the write control circuit 170.

In a case where the write data WDATA to be written is 10, the first comparison signal PASS1 may indicate a determination result using the fourth reference voltage VRH2 and the second comparison signal PASS2 may indicate a determination result using the fifth reference voltage VRL3. An exemplary write driver 180 will be described in some additional detail with reference to FIGS. 8 and 9.

The write control circuit 170 supplies a control signal CON so as to increase or decrease the amount of the write current on the basis of the verification result of the verification sense amplifier 140.

For example, when the first comparison signal PASS1 is logically low (e.g., indicating that the actual resistance of the phase change memory cell is less than fourth reference resistance RH2), the write control circuit 170 supplies the control signal CON to increase the amount of the write current. When the second comparison signal PASS2 is high (e.g., indicating that the actual resistance of the phase change memory cell is greater than fifth reference resistance RL3), the write control circuit 170 supplies the control signal CON to decrease the amount of the write current. Further, when the first comparison signal PASS1 is high and the second comparison signal PASS2 is low (e.g., indicating that the actual resistance of the phase change memory cell resides in the intended resistance window corresponding to the data 10), write control circuit 170 supplies the control signal CON, such that the write driver 180 discontinues the supply of write current.

Thus, the write driver 180 supplies the write current to the phase change memory cell while increasing or decreasing the amount of the write current in response to the control signal CON.

Figure 8:
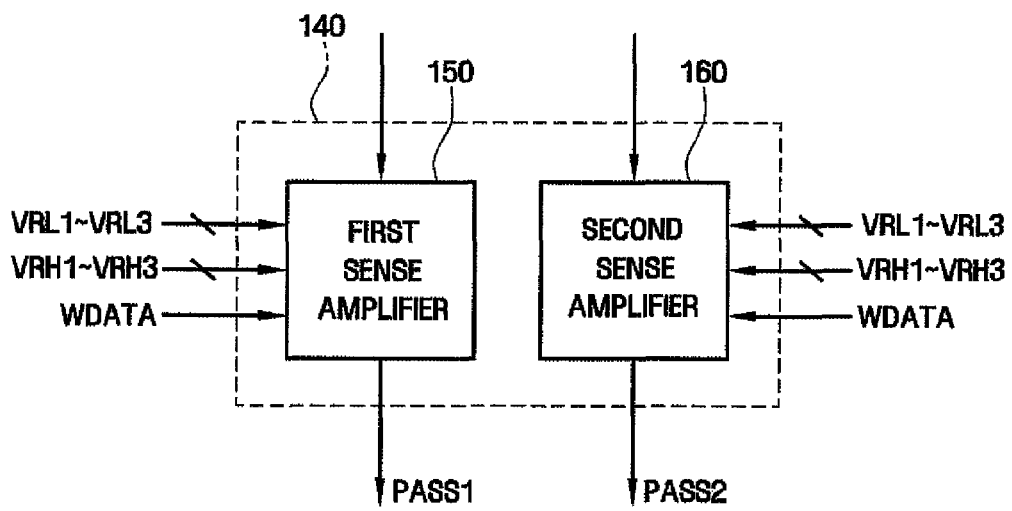
FIG. 8 is an exemplary block diagram showing a verification sense amplifier shown in FIG. 7.
Figure 9:
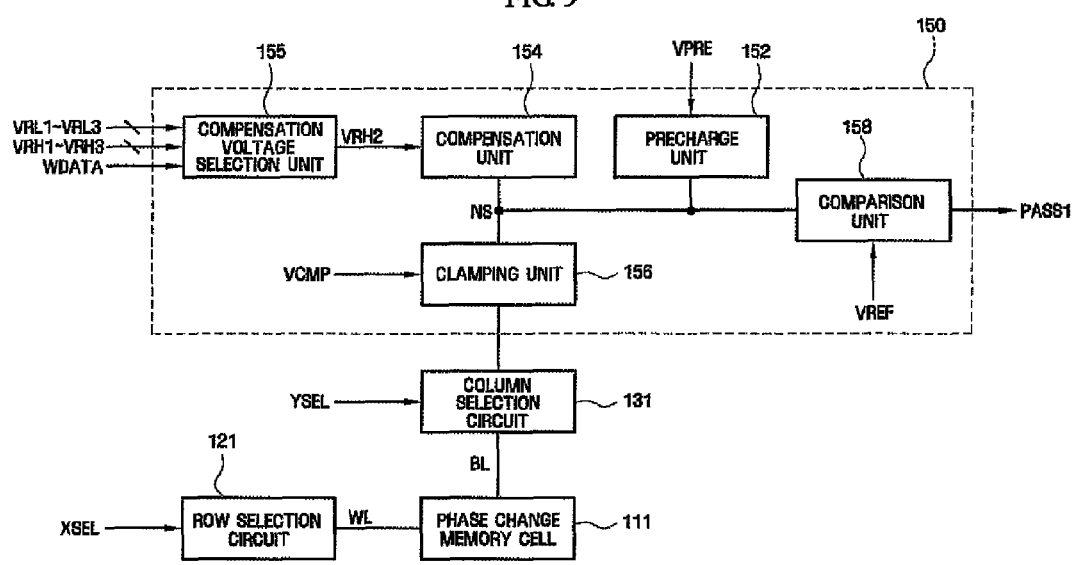
FIG. 9 is an exemplary block diagram showing a first sense amplifier shown in FIG. 8.

FIG. 8 is an exemplary block diagram showing the verification sense amplifier of FIG. 7 in some additional detail. FIG. 9 is an exemplary block diagram showing the first sense amplifier of FIG. 8 in some additional detail. In FIG. 9, a row selection circuit 121, a column selection circuit 131, and a phase change memory cell 111 are described as well as the first sense amplifier for convenience of explanation.

Referring to FIG. 8, the verification sense amplifier 140 includes first and second sense amplifiers 150 and 160 that receive the first to sixth reference voltages VRL1 to VRL3 and VRH1 and VRH3 and the write data WDATA. In a case where the write data WDATA to be written is 01, the first sense amplifier 150 performs sensing using the fourth reference voltage VRH2 and supplies the first comparison signal PASS1, and the second sense amplifier 160 performs sensing using the fifth reference voltage VRL3 and supplies the second comparison signal PASS2. In the exemplary block diagram of FIG. 8, the number of sense amplifiers is determined according to the number of reference voltages necessary for sensing. This will be true for all embodiments of the invention.

Referring to FIG. 9, the column selection circuit 131 receives a column selection signal YSEL to select a bit line BL and the row selection circuit 121 receives a row selection signal XSEL to select a word line WL, thereby selecting the phase change memory cell 111 to be written.

The first sense amplifier 150 applies a current to the selected phase change memory cell 111 and senses a change in level of a sensing node NS that occurs due to a current flowing through the selected phase change memory cell 111 so as to read data.

The above-described sense amplifier 150 may include a precharge unit 152, a compensation unit 154, a compensation voltage selection unit 155, a clamping unit 156, and a comparison unit 158.

The precharge unit 152 precharges a sensing node with a predetermined level, for example, a power supply voltage VDD during a precharge period before the sensing operation. The precharge unit 152 may be a PMOS transistor that is coupled between the power supply voltage VDD and the sensing node NS, and has a gate to which a precharge control signal VPRE is applied.

The compensation unit 154 supplies a compensation current to the sensing node NS so as to compensate a reduction in level of the sensing node NS that occurs due to a current flowing through the selected phase change memory cell 111. In particular, when the data 00 is stored in the phase change memory cell 111, since resistance of the phase change material is small, the amount of the current flowing through the selected phase change memory cell 111 is large. Further, when the data 11 is stored in the phase change memory cell 111, since resistance of the phase change material is large, the amount of the current flowing through the selected phase change memory cell 111 (i.e., "cell current") is small. When it is expressed by an inequality, it can be expressed as "the amount of the cell current in case of data 00">"the amount of the cell current in case of data 01">"the amount of the cell current in case of data 10">"the amount of the cell current in case of data 11". For example, when the amount of the current supplied from the compensation unit 154 corresponds to a cell current in cases of data 10 and data 11, the levels at the sensing node NS for the data 10 and data 11 are kept unchanged, but the levels at the sensing node NS for the data 00 and data 01 are reduced. Therefore, it is possible to distinguish the data 00, data 01, data 10, and data 11 by adjusting the amount of the compensation current supplied from the compensation unit 154. The compensation unit 154 may be a PMOS transistor coupled between the power supply voltage VDD and the sensing node NS, and having a gate receiving the compensation voltage. In this case, the amount of the compensation current may be adjusted by adjusting the compensation voltage.

The compensation voltage selection unit 155 receives the first to sixth reference voltages VRL1 to VRL3 and VRH1 to VRH3 and the write data WDATA to be written, and supplies the reference voltage corresponding to the write data WDATA to be written. The example of FIG. 9 shows a case where the fourth reference voltage VRH2 is selected as the compensation voltage.

The clamping unit 156 performs clamping with respect to a level of the bit line BL within an appropriate range to be read. In particular, the clamping unit 156 performs clamping with respect to the level of the bit line BL to a predetermined level lower than a threshold voltage Vth of the phase change material. This is because a phase of the phase change material of the selected phase change memory cell 111 may change when the level of the bit line BL becomes equal to or greater than the threshold voltage Vth. The clamping unit 156 may be an NMOS transistor coupled between the bit line BL and the sensing node NS, and having a gate receiving a clamping control signal VCMP.

The comparison unit 158 compares the level of the sensing node NS and the reference level REF and outputs the comparison signal PASS1.

When the fourth reference voltage VRH2 is selected as the compensation voltage, if the actual resistance of the phase change memory cell is less than fourth reference resistance RH2, the level of the sensing node NS goes down and the comparison signal PASS1 is output as a logically low value. If resistance of the phase change memory cell is greater than fourth reference resistance RH2, the level of the sensing node NS is remains unchanged and the comparison signal PASS1 is output as a logically high value.

From here, the reference voltage VRL1~VRL3, VRH1~VRH3 and clamping control signal VCMP are explained. From here, a compensation control signal VBIAS may be at least one of the reference voltage VRL1~VRL3, VRH1~VRH3.

Figure 10A:
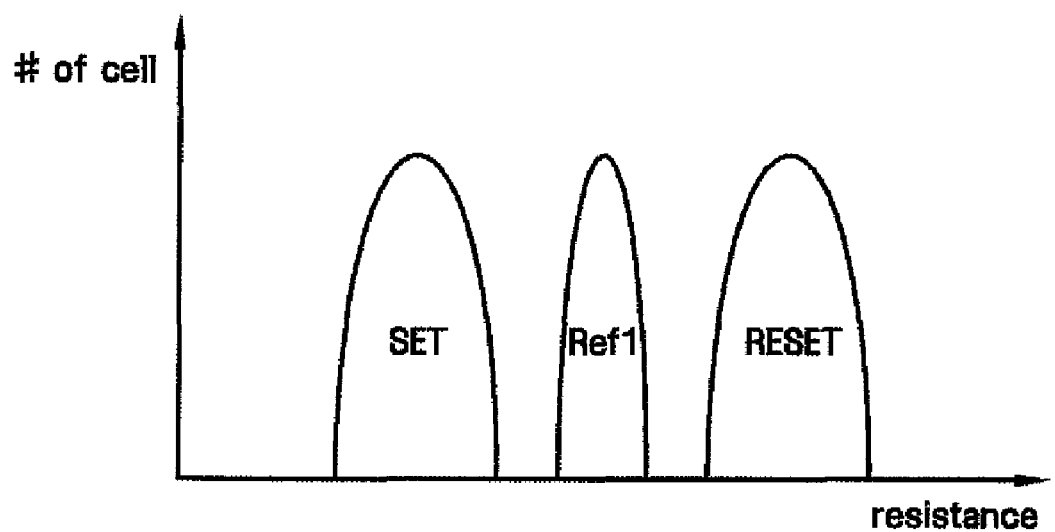
FIGS. 10A through 12 are diagrams for explaining a non-volatile memory device according to a fifth embodiment of the present invention.
Figure 10B:
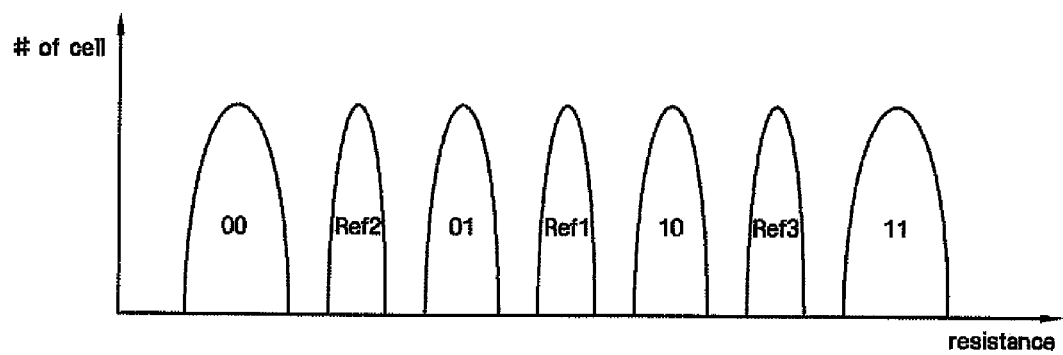
Figure 11:
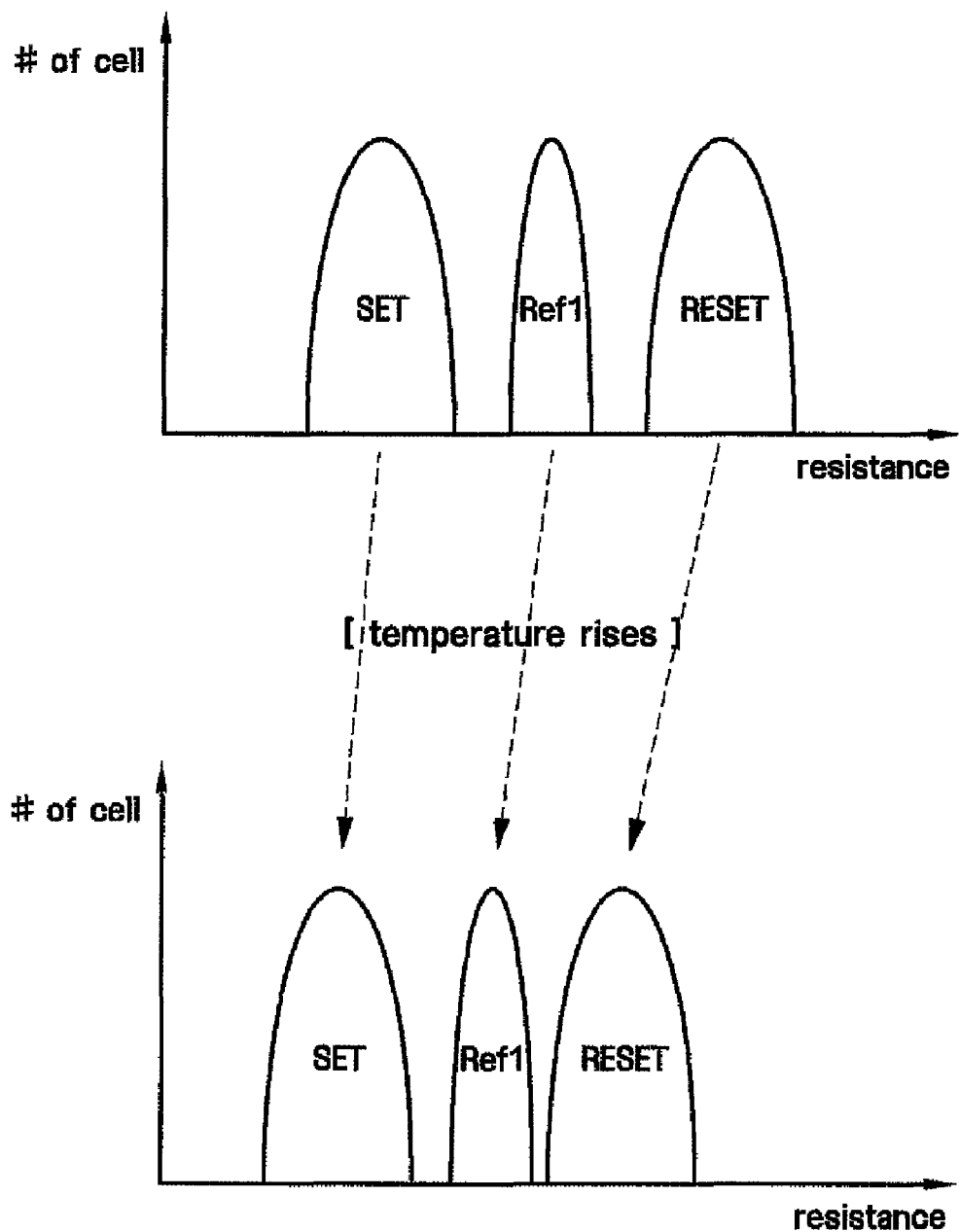
Figure 12:
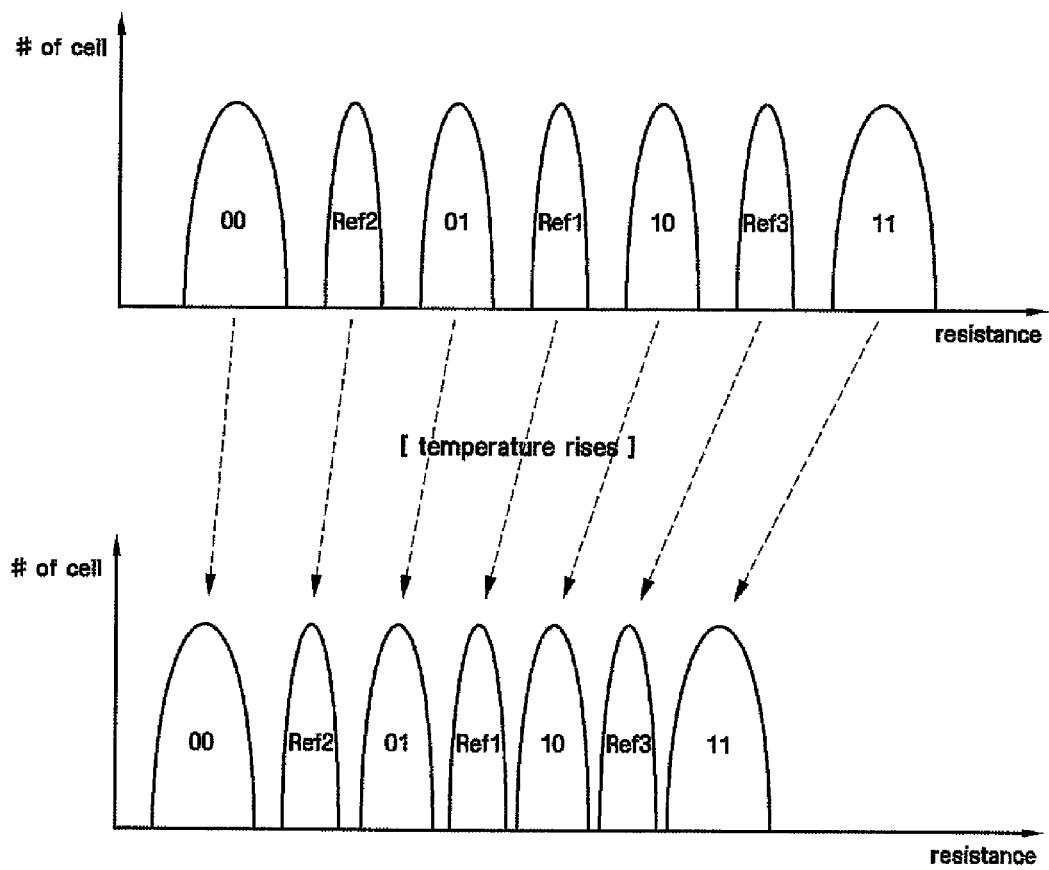

FIGS. 10A through 12 are diagrams for explaining a nonvolatile memory device according to a fifth embodiment of the present invention. Specifically, FIGS. 10A and 11 are diagrams related to single-level cells (i.e., 1 bit-level cells), and FIGS. 10B and 12 are diagrams related to multi-level cells (i.e., n bit-level cells where "n" is a natural number equal to or greater than two).

In the nonvolatile memory device according to the fifth embodiment of the present invention, each nonvolatile memory cell has any one of a plurality of first resistance distributions. Here, the first resistance distributions do not overlap each other, that is, are separated from each other to secure a margin.

For example, when the nonvolatile memory cells are single-level cells, the first resistance distributions may include two (=21) kinds of resistance distributions, i.e., a set resistance distribution SET and a reset resistance distribution RESET, as illustrated in FIG. 10A. Here, each of the nonvolatile memory cells may have resistance corresponding to any one of the first resistance distributions.

When the nonvolatile memory cells are multi-level cells, each of the nonvolatile memory cells may have any one of $2^n$ different kinds of resistance distributions. For example, when the nonvolatile memory cells are 2 bit multi-level cells, the first resistance distributions may include four (=$2^2$) kinds of resistance distributions, i.e., 00, 01, 10, and 11, as illustrated in FIG. 10B. Here, each of the nonvolatile memory cells may have resistance corresponding to any one of the first resistance distributions. In addition, each of the resistance distributions 00, 01, 10, and 11 may be determined by the amount of amorphous material contained in a phase-change material. For example, the resistance distribution 00 may be determined when the phase-change material is crystalline, and the amount of amorphous material contained in the phase-change material may increase in the order of the resistance distributions 01, 10, and 11.

The nonvolatile memory device according to the fifth embodiment of the present invention may also include one or more reference cells for adjusting the amount of compensation current or clamping current to enhance the reliability of a read operation. The reference cells may be identical to the nonvolatile memory cells. That is, like the nonvolatile memory cells, the reference cells each may include a variable resistance element and an access element, and the variable resistance element may be a phase-change material.

Each of the reference cells has any one of a plurality of second resistance distributions. The second resistance distributions may not overlap the first resistance distributions of the nonvolatile memory cells.

When the nonvolatile memory cells are single-level cells, the reference cells have one resistance distribution Ref1, as illustrated in FIG. 10A. On the other hand, when the nonvolatile memory cells are multi-level cells (i.e., n bit-level cells), the reference cells have $2^n-1$ resistance distributions. For example, when the nonvolatile memory cells are 2 bit multi-level cells, three different resistance distributions Ref1, Ref2, and Ref3 may be generated as illustrated in FIG. 10B. Consequentially, when the nonvolatile memory cells are m bit-level cells ("m" is a natural number), the reference cells have $2^m-1$ resistance distributions.

Referring to FIGS. 10A and 10B, any one of the second resistance distributions may be located between two adjacent ones of the first resistance distributions. For example, referring to FIG. 10B, the resistance distribution Ref2 is located between the resistance distributions 00 and 01, the resistance distribution Ref1 is located between the resistance distributions 01 and 10, and the resistance distribution Ref3 is located between the resistance distributions 10 and 11.

Referring to FIG. 11, the resistance distributions of the nonvolatile memory cells and the resistance distributions of the reference cells change as temperature rises. That is, as temperature rises, the reset resistance distribution RESET is reduced more significantly than the set resistance distribution SET. Therefore, as temperature rises, a margin between the set resistance distribution SET and the reset resistance distribution RESET is reduced.

However, the arrangement of the set resistance distribution SET, the resistance distribution Ref1 of the reference cells, and the reset resistance distribution RESET remains unchanged before and after temperature rises. In addition, the set resistance distribution SET, the resistance distribution Ref1 of the reference cells, and the reset resistance distribution RESET still do not overlap each other. Therefore, the resistance of the reference cells may be used to clearly discriminate between set resistance and reset resistance.

Referring to FIG. 12, the resistance distributions of the nonvolatile memory cells and the resistance distributions of the reference cells change as temperature rises. That is, as temperature rises, the degree by which the resistance distribution is reduced increases in the order of the resistance distributions 00, 01, 10, and 11. Therefore, as temperature rises, margins between the resistance distributions 00, 01, 10, and 11 are reduced.

However, the arrangement of the resistance distributions 00, 01, 10, and 11, and the resistance distributions Ref1, Ref2, and Ref3 of the reference cells remains unchanged before and after temperature rises. In addition, the resistance distributions 00, 01, 10, and 11, and the resistance distributions Ref1, Ref2, and Ref3 of the reference cells still do not overlap each other. Therefore, the resistances of the reference cells may be used to clearly discriminate among resistances corresponding to the resistance distributions 00, 01, 10, and 11.

In some embodiments of the present invention, the resistances of the reference cells are used to adjust the amount of compensation current or clamping current. As described above with reference to FIGS. 11 and 12, the resistance change of the reference cells according to temperature may fully reflect the resistance change of the nonvolatile memory cells according to temperature. That is, a change in the resistance of the reference cells according to temperature may be equal to a change in the resistance of the nonvolatile memory cells according to temperature. Therefore, the amount of compensation current or clamping current may fully reflect temperature changes.

The amount of compensation current or clamping current can be adjusted more accurately by using the resistance change of the reference cells. This is because the resistance change of the reference cells can accurately reflect the resistance change of the nonvolatile memory cells since the reference cells and the nonvolatile memory cells are the same type of memory cells.

A specific configuration (block or circuit) for adjusting the amount of compensation current or clamping current using the reference cells will now be described.

Figure 13:
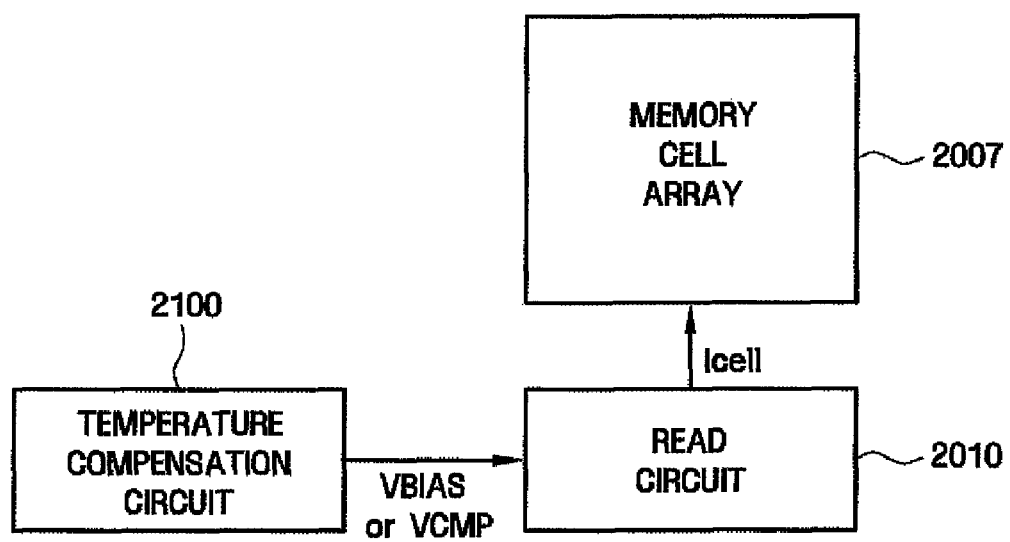
FIG. 13 is a block diagram of the nonvolatile memory device according to the fifth embodiment of the present invention.

FIG. 13 is a block diagram of the nonvolatile memory device according to the fifth embodiment of the present invention. In FIG. 13, a case where a verification read operation is performed using the resistance of the reference cells will be described based on the description made with reference to FIGS. 10A through 12.

Referring to FIG. 13, the nonvolatile memory device according to the fifth embodiment of the present invention includes a memory cell array 2007, a read circuit 2010, and a temperature compensation circuit 2100. The read circuit 2010 may be verification sense amplifier 140 of the FIG. 7.

The memory cell array 2007 includes a plurality of nonvolatile memory cells. Each of the nonvolatile memory cells has resistance corresponding to any one of the first resistance distributions. That is, when the nonvolatile memory cells are single-level cells, each of the nonvolatile memory cells has the set resistance or the reset resistance. When the nonvolatile memory cells are multi-level cells, each of the nonvolatile memory cells has resistance corresponding to any one of the resistance distributions 00, 01, 10, and 11.

The temperature compensation circuit 2100 includes one or more reference cells. Each of the reference cells has resistance corresponding to any one of the second resistance distributions. That is, each of the reference cells may have the resistance distribution Ref1 as illustrated in FIG. 10A or may have any one of the resistance distributions Ref1 through Ref3 as illustrated in FIG. 10B.

Meanwhile, one or more reference cells may form a reference set. For example, the number of resistance distributions that the reference cells can have may be equal to the number of reference cells included in a reference set. When the nonvolatile memory cells are single-level cells, the reference cells may have one reference level Ref1. When the nonvolatile memory cells are multi-level cells (n bit-level cells), the reference cells may have $2^n-1$ resistance levels. Therefore, when the nonvolatile memory cells are single-level cells, one reference cell is included in a reference set. When the nonvolatile memory cells are multi-level cells (n bit-level cells), $2^n-1$ reference cells are included in the reference set. For example, referring to FIG. 10B, three ($=2^2-1$) reference cells may be included in a reference set. Consequently, when the nonvolatile memory cells are m bit-level cells ("m" is a natural number), $2^m-1$ reference cells are included in the same reference set.

The $2^m-1$ reference cells included in the same reference set may respectively have resistances corresponding to different resistance distributions. For example, when the nonvolatile memory cells are 2 bit-level cells, three reference cells may be included in the same reference set. Here, the three reference cells may respectively have resistances corresponding to different resistance distributions, i.e., Ref1 through Ref3.

The temperature compensation circuit 2100 may generate a compensation control signal VBIAS or a clamp control signal VCMP that changes according to the resistance of the reference cells. As described above with reference to FIGS. 11 and 12, the resistance of the reference cells changes according to temperature. Accordingly, the compensation control signal VBIAS or the clamp control signal VCMP also changes according to temperature. The detailed configuration and operation of the temperature compensation circuit 2100 will be described later with reference to FIGS. 14 through 18.

Figure 14:
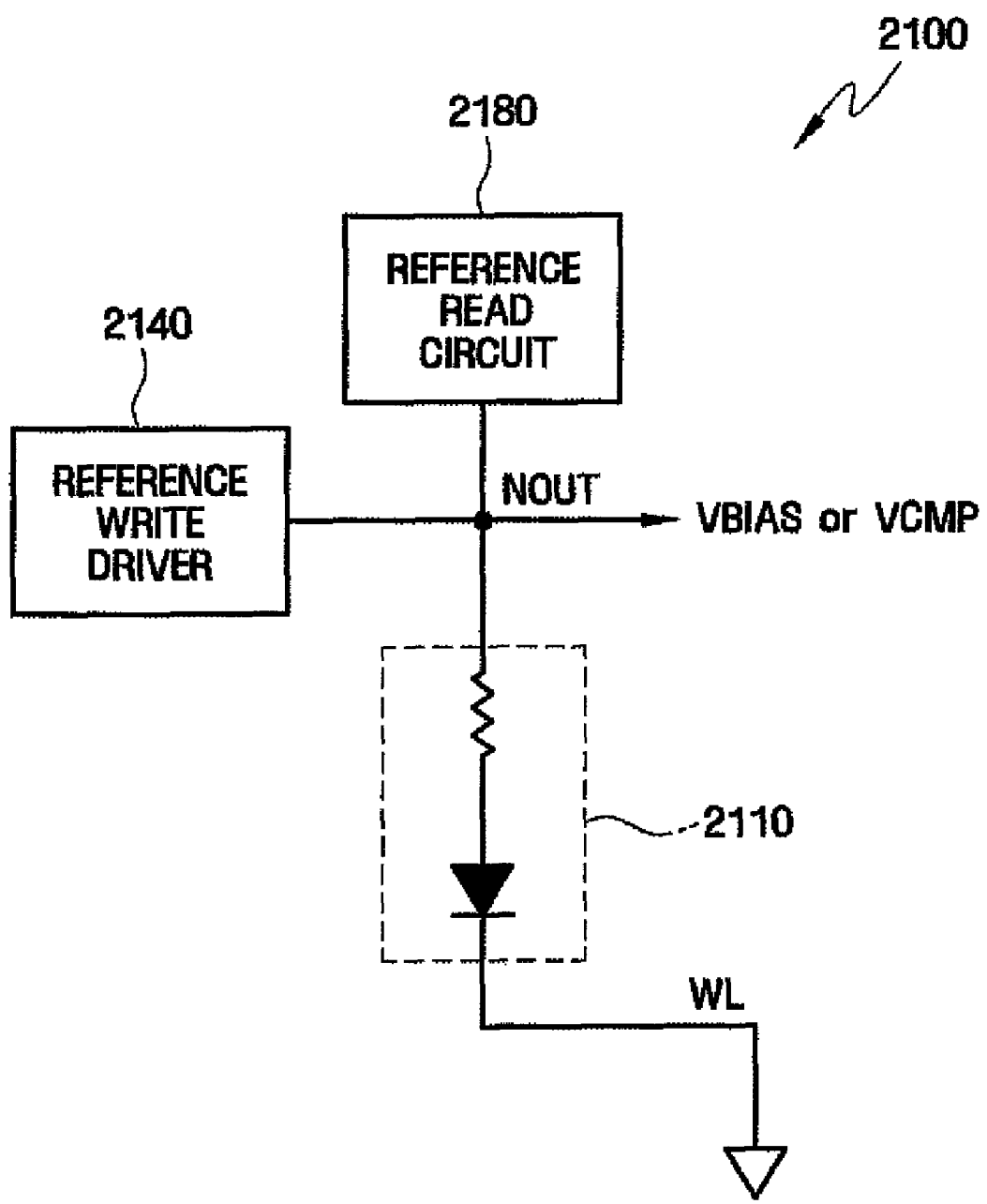
FIG. 14 is an exemplary block diagram of the temperature compensation circuit 2100 illustrated in FIG. 13.

FIG. 14 is an exemplary block diagram of the temperature compensation circuit 2100 illustrated in FIG. 13.

Referring to FIG. 14, the temperature compensation circuit 2100 includes a reference cell 2110, a reference write driver 2140, a reference read circuit 2180, and an output node NOUT.

The reference write driver 2140 is connected to the output node NOUT, supplies a write current to the reference cell 2110, and determines the resistance distribution of the reference cell 2110. The detailed structure of the reference write driver 2140 will be described later with reference to FIG. 15.

The reference read circuit 2180 is connected to the output node NOUT, supplies a read current to the reference cell 2110, and reads the resistance distribution of the reference cell 2110. That is, the reference read circuit 2180 identifies whether the resistance (i.e., resistance distribution) of the reference cell 2110 is located at a desired position.

When the resistance distribution of the reference cell 2110 is not located at the desired position, the reference write driver 2140 supplies a write current again to the reference cell 2110 and determines the resistance distribution of the reference cell 2110.

When the resistance distribution of the reference cell 2110 is located at the desired position, the compensation control signal VBIAS or the clamp control signal VCMP, which changes according to the resistance level of the reference cell 2110, is output through the output node NOUT. The resistance distribution of the reference cell 2110 depends on the temperature.

Changing the compensation control signal VBIAS according to the temperature means changing the reference voltage VRL1~VRL3, VRH1~VRH3 according to the temperature. Thus, changing the reference voltage VRL1~VRL3, VRH1~VRH3 according to the temperature changing the resistance window according to the temperature. That is, the resistance window depends on the resistance of the reference cells.

The detailed structure of the reference read circuit 2180 will be described later with reference to FIGS. 16 through 18.

The reference write driver 2140 may be a replica circuit of a write driver which determines resistance distributions of the nonvolatile memory cells by supplying a write current to the nonvolatile memory cells. The reference read circuit 2180 may be a replica circuit of a read circuit (see FIG. 3) which reads the resistance distributions of the nonvolatile memory cells by supplying a read circuit to the nonvolatile memory cells. Since the reference cell 2110 is identical to each nonvolatile memory cell as described above, a change in the resistance of the reference cell 2110 according to temperature can fully reflect a change in the resistance of each nonvolatile memory cell according to temperature. Here, if the reference write driver 2140 and the reference read circuit 2180 are replica circuits, the resistance change of the reference cell 2110 according to temperature can more accurately reflect the resistance change of each nonvolatile memory cell according to temperature. However, the reference write driver 2140 and the reference read circuit 2180 are not limited to the replica circuits.

Figure 15:
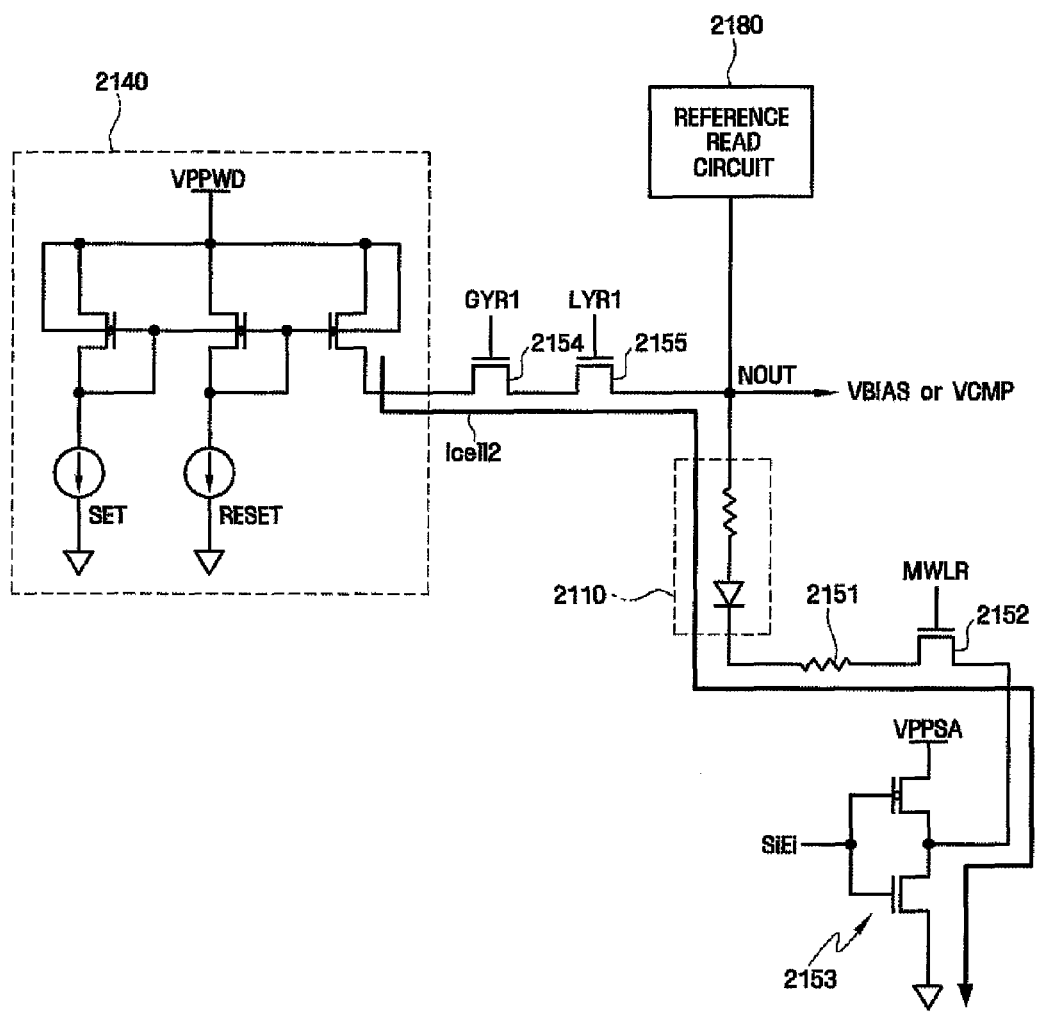
FIG. 15 is an exemplary circuit diagram of the reference write driver 2140 illustrated in FIG. 14 and a portion related to a write operation.

FIG. 15 is an exemplary circuit diagram of the reference write driver 2140 illustrated in FIG. 14 and a portion related to a write operation.

Referring to FIG. 15, the reference write driver 2140 supplies a write current Icell2 to write set data or reset data.

As illustrated in FIG. 15, the write current Icell2 is output to a ground source via a first transistor 2154, a second transistor 2155, the reference cell 2110, a first resistor 2151, a third transistor 2152, and then an inverter 2153.

Here, a global column select replica signal GYR1 is transmitted to the first transistor 2154, a row column select replica signal LYR1 is transmitted to the second transistor 2155, and a main word line replica signal MWLR is transmitted to the third transistor 2152. That is, the first transistor 2154 is a replica of a global column select circuit, the second transistor 2155 is a replica of a row column select circuit, and the third transistor 2152 is a replica of a main word line select circuit. In addition, the first resistor 2151 is a replica of a resistor in an active region of a substrate. A path of the write current Icell2 used to write the reference cell 2110 may be made identical to a path of a write current used to write a nonvolatile memory cell by configuring the first transistor 2154, the second transistor 2155, the first resistor 2151, the third transistor 2152, and the inverter 2153 as described above.

Figure 16:
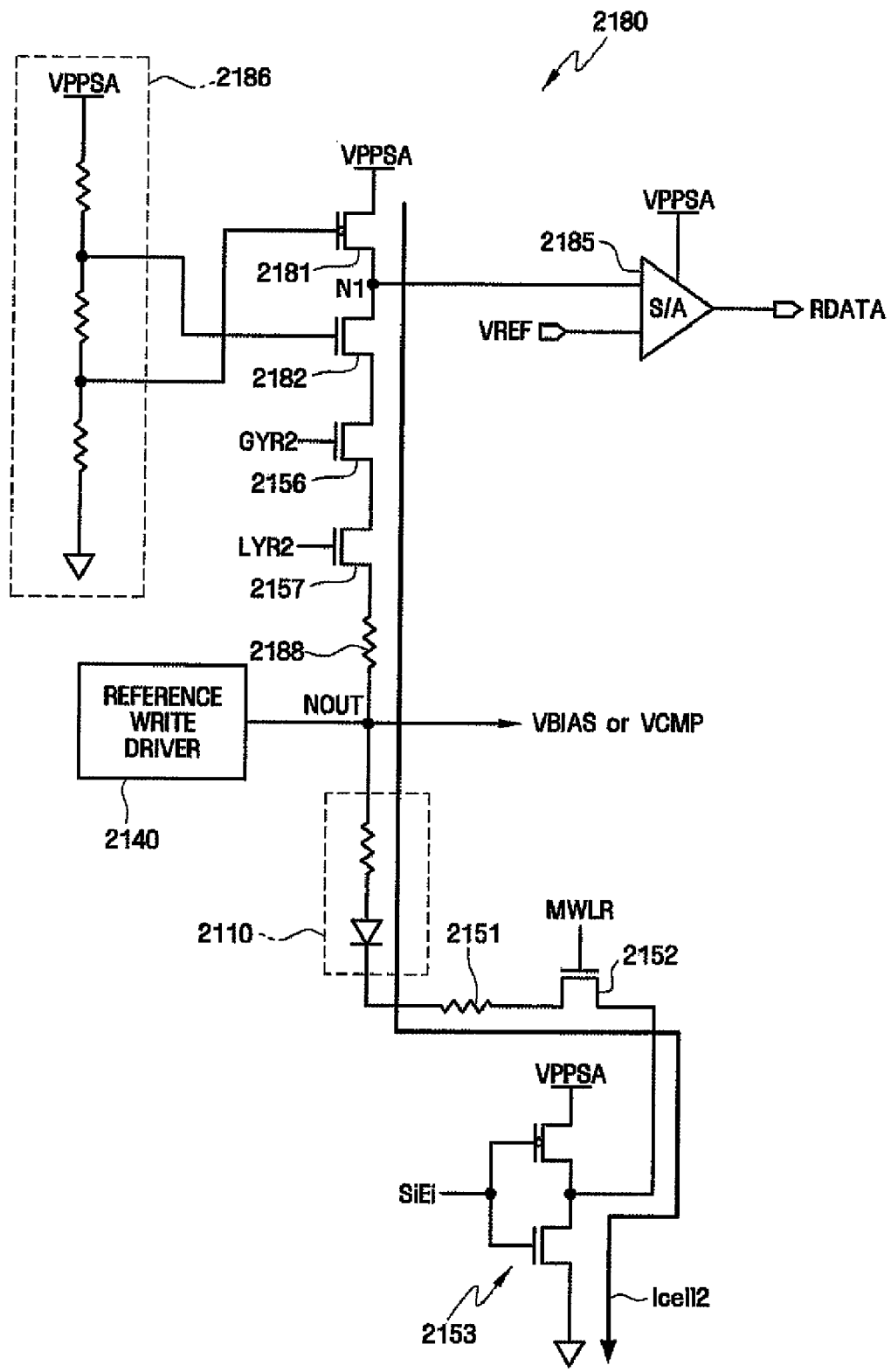
FIG. 16 is an exemplary circuit diagram of the reference read circuit 2180 illustrated in FIG. 14 and a portion related to a read operation.

FIG. 16 is an exemplary circuit diagram of the reference read circuit 2180 illustrated in FIG. 14 and a portion related to a read operation.

Referring to FIG. 16, the reference read circuit 2180 includes a fourth transistor 2181, a fifth transistor 2182, a sense amplifier 2185, a resistor string 2186, and a second resistor 2188.

The fourth transistor 2181 and the fifth transistor 2182 are connected in series between a step-up voltage source VPPSA and an output node NOUT. A plurality of resistors in the resistance string 2186 are connected in series between the step-up voltage source VPPSA and a ground source and provides a first voltage and a second voltage. The first voltage is applied to a gate of the fourth transistor 2181, and the second voltage is applied to a gate of the fifth transistor 2182. Here, the fourth transistor 2181 is a replica of the compensation unit 1014 (see FIG. 9B), and the fifth transistor 2182 is a replica of the clamping unit 1016 (see FIG. 9B). The second resistor 2188 is, but not limited to, a replica of a bit line.

As illustrated in FIG. 16, a read current Icell3 is output to the ground voltage source via the step-up voltage source VPPSA, the fourth transistor 2181, the fifth transistor 2182, a sixth transistor 2156, a seventh transistor 2157, the second resistor 2188, the reference cell 2110, the first resistor 2151, the third transistor 2152, and then the inverter 2153.

Here, a global column select replica signal GYR2 is transmitted to the sixth transistor 2156, and a local column select replica signal LYR2 is transmitted to the seventh transistor 2157. That is, the sixth transistor 2156 is a replica of a global column select circuit, and the seventh transistor 2157 is a replica of a local column select circuit. A path of the read current Icell3 used to read the reference cell 2110 may be made identical to a path of a read current used to read a nonvolatile memory cell by configuring the fourth transistor 2181, the fifth transistor 2182, the sixth transistor 2156, the seventh transistor 2157, the first resistor 2151, the third transistor 2152, and the inverter 2153 as described above.

The sense amplifier 2185 outputs reference data RDATA by comparing a node N1 and a reference voltage VREF. The reference data RDATA is read to determine whether the resistance of the reference cell 2110 has a desired value.

When the resistance of the reference cell 2110 does not have the desired value, a write operation is performed again.

When the resistance of the reference cell 2110 has the desired value, the compensation control signal VBIAS or the clamp control signal VCMP may be output through the output node NOUT. For example, the voltage of the output node NOUT may also be output as the compensation control signal VBIAS or the clamp control signal VCMP.

Alternatively, as will be described with reference to FIG. 18, the voltage of the output node NOUT may be adjusted through trimming, and the adjusted voltage of the output node NOUT may be output as the compensation control signal VBIAS or the clamp control signal VCMP.

Alternatively, the resistance of the second resistor 2188 may be controlled to adjust a voltage that is output to the output node NOUT. This is because the voltage output to the output node NOUT may be a voltage divided by the resistance of the second resistor 2188 and that of the reference cell 2110. Here, it is assumed that the resistances of the fourth transistor 2181, the fifth transistor 2182, the sixth transistor 2156, the seventh transistor 2157, and the third transistor 2152 are significantly small. Since the resistance of the reference cell 2110 will be determined by a write operation, if the resistance of the second resistor 2188 is adjusted in a manufacturing process, the voltage output to the output node NOUT can be easily adjusted.

Figure 17:
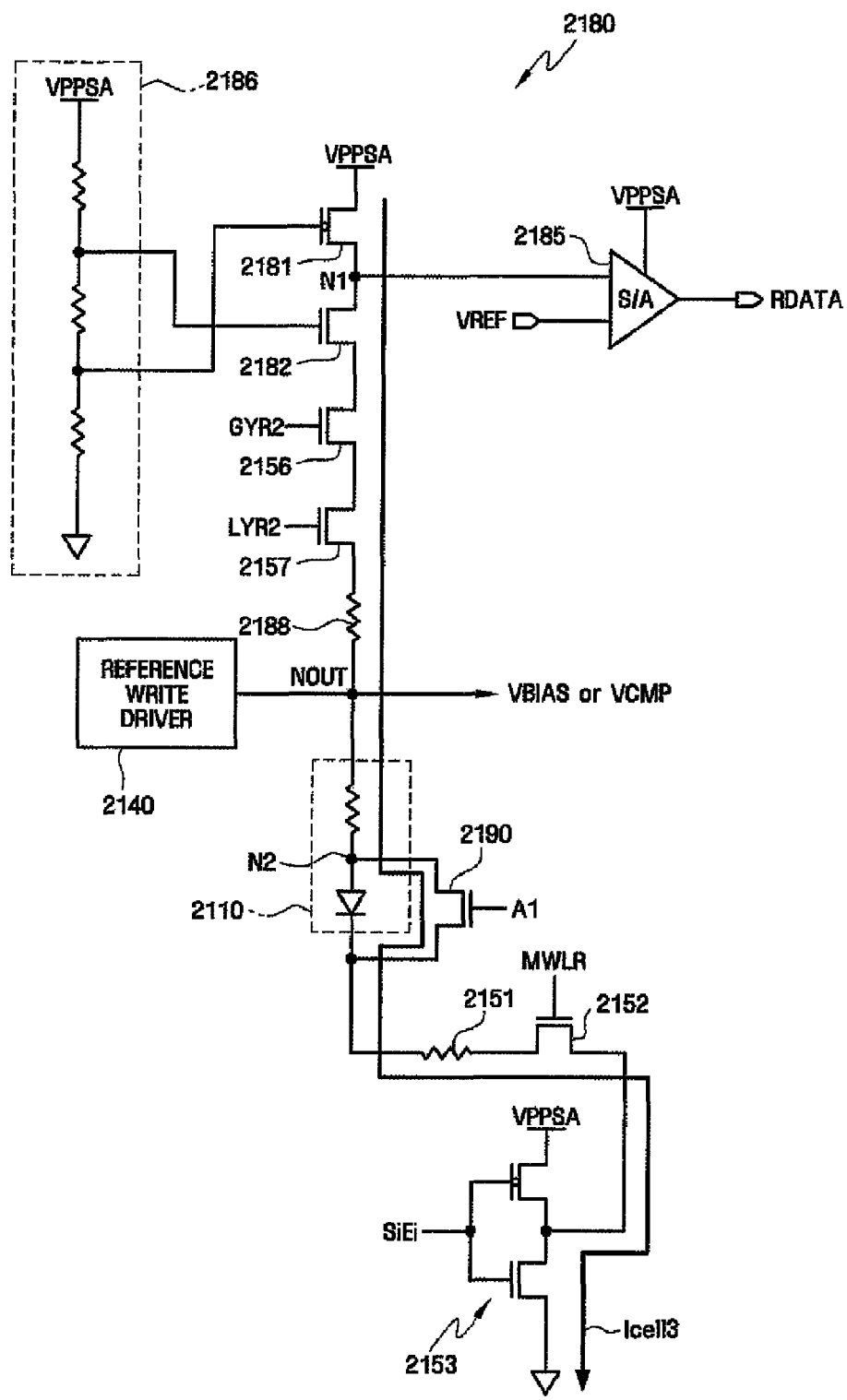
FIG. 17 is another exemplary circuit diagram of the reference read circuit 180 illustrated in FIG. 14 and a portion related to a read operation.

FIG. 17 is another exemplary circuit diagram of the reference read circuit 2180 illustrated in FIG. 14 and a portion related to a read operation.

Referring to FIG. 17, the circuit of FIG. 17 is different from that of FIG. 16 in that it further includes a bypass circuit 2190. When a reference cell 2110 is read, the bypass circuit 2190 is turned on in response to a control signal A1. Therefore, while a read current Icell3 passes through a variable resistance element, it bypasses an access element (that is, a diode).

After the reference cell 2110 is read, if it is found out that the resistance of the reference cell 2110 does not have a desired value, the reference cell 2110 must be re-programmed. Thus, it is desirable to minimize the time required to read the reference cell 2110. The bypass circuit 2190 is implemented to reduce a period of time required by the read current Icell3 to pass through an n-type semiconductor of the diode, thereby reducing the total read time.

On the other hand, when a write operation is performed, the bypass circuit 2190 is turned off so that a current flows toward the access element (the diode).

Figure 18:
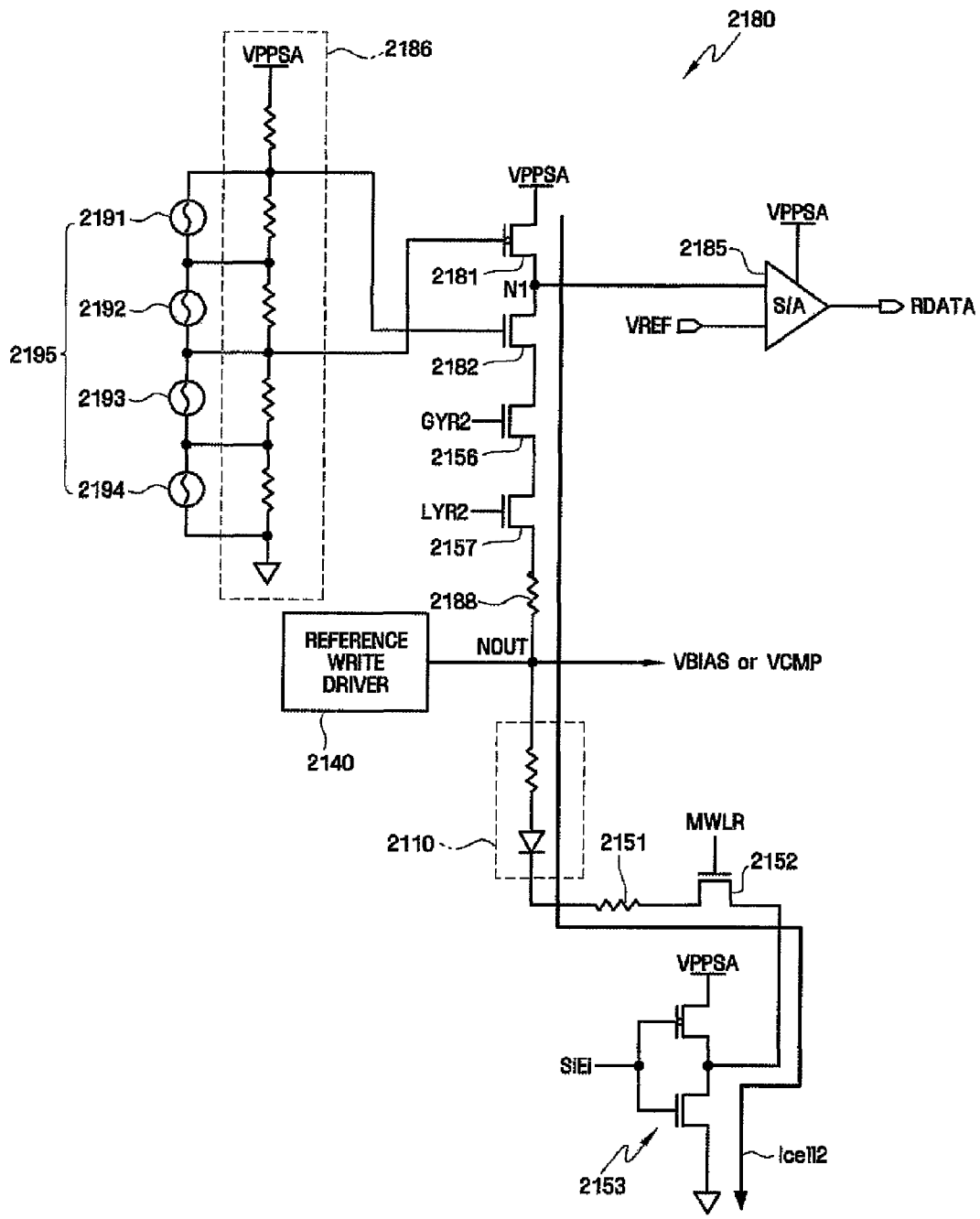
FIG. 18 is another exemplary circuit diagram of the reference read circuit 180 illustrated in FIG. 14 and a portion related to a read operation.

FIG. 18 is another exemplary circuit diagram of the reference read circuit 2180 illustrated in FIG. 14 and a portion related to a read operation.

Referring to FIG. 18, the circuit of FIG. 18 is different from that of FIG. 16 in that it further includes a trimming circuit 2195. The trimming circuit 2195 may include a plurality of fuses 2191 through 2194.

At least one of the fuses 2191 through 2194 may be cut using a mode resister set (MRS) to adjust the level of voltage applied to a fourth transistor 2181 and a fifth transistor 2182.

A voltage value of a compensation control signal VBIAS or a clamp control signal VCMP output through an output node NOUT may be adjusted using the trimming circuit 2195. That is, even when the resistance of a reference cell 2110 has a desired value, if the voltage value of the compensation control signal VBIAS or the clamp control signal VCMP needs to be precisely adjusted, the trimming circuit 2195 can be used.

Figure 19:
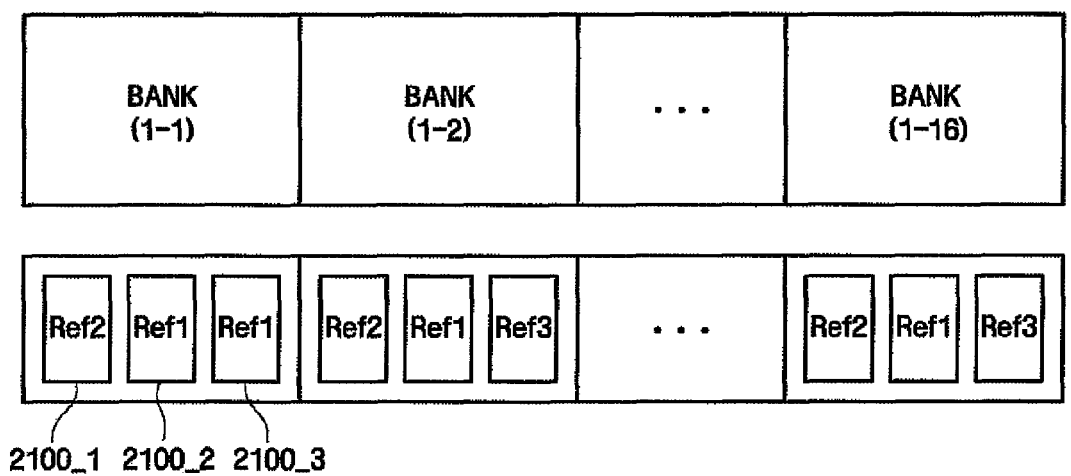
FIG. 19 is a diagram for explaining a nonvolatile memory device according to a sixth embodiment of the present invention.

FIG. 19 is a diagram for explaining a nonvolatile memory device according to a sixth embodiment of the present invention.

Referring to FIG. 19, a circuit of FIG. 19 is different from the circuit of FIG. 16 in that a plurality of reference sets are respectively disposed corresponding to a plurality of memory banks. As described above, when nonvolatile memory cells are 2 bit-level cells, there may be three (=22−1) reference cells, and each of the three reference cells may store a resistance value corresponding to one of resistance distributions Ref1 through Ref3. Therefore, as illustrated in FIG. 19, three temperature compensation circuits 2100_1 through 2100_3 may corresponds to each of the memory banks. Each of the three temperature compensation circuits 2100_1 through 2100_3 includes a corresponding one of the three reference cells.

Figure 20:
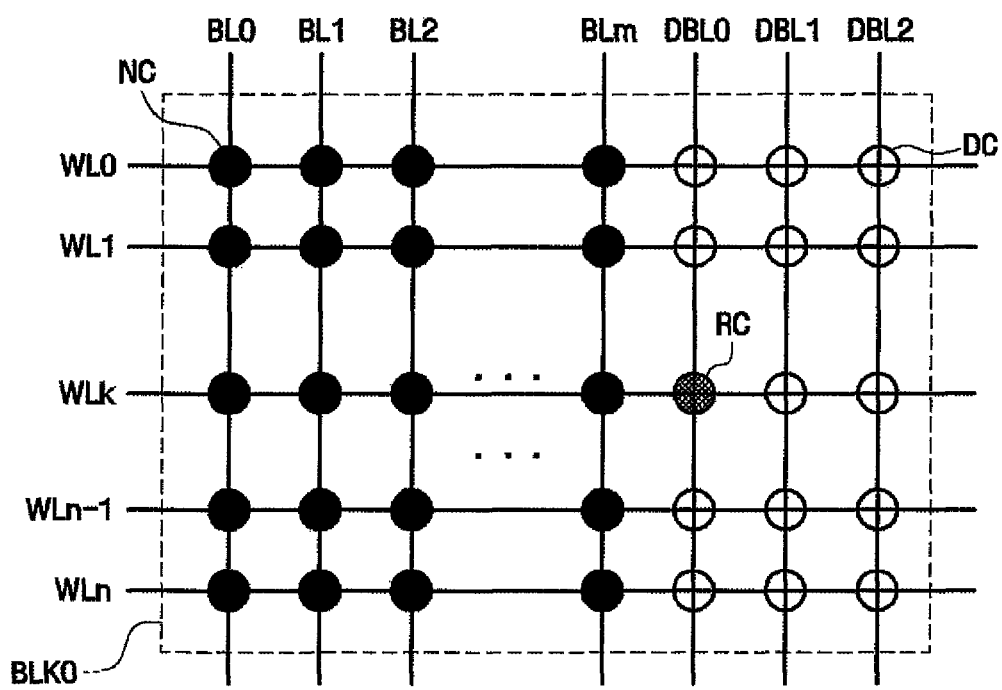
FIGS. 20 and 21 are diagrams for explaining nonvolatile memory devices according to sixth through eighth embodiments of the present invention.
Figure 21:
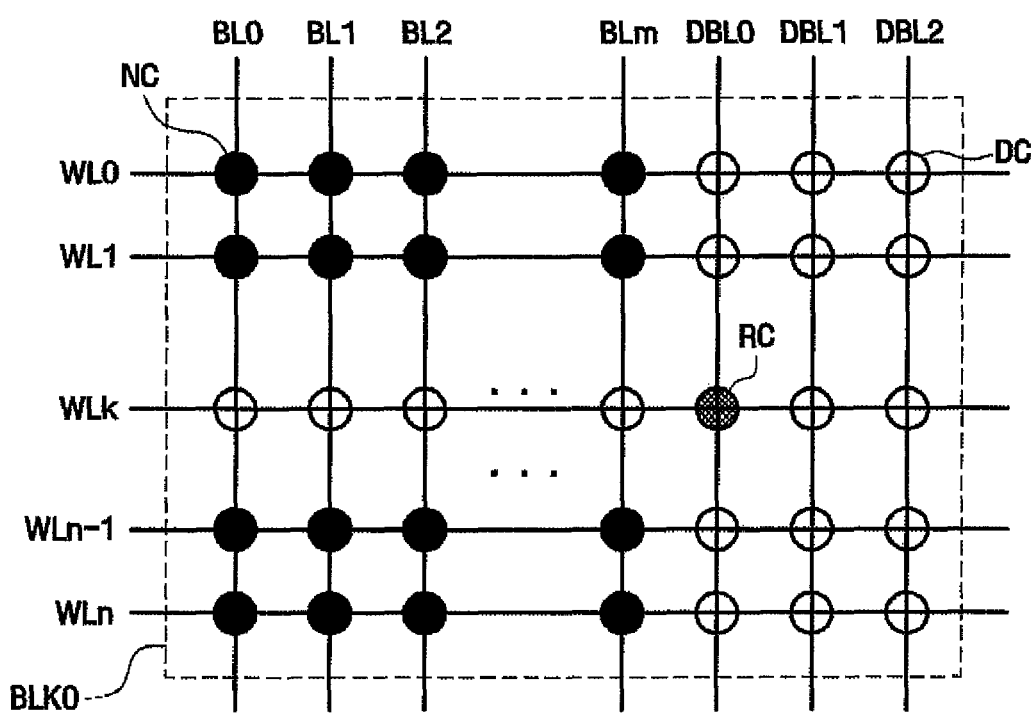

FIGS. 20 and 21 are diagrams for explaining nonvolatile memory devices according to sixth through eighth embodiments of the present invention. In FIGS. 20 and 21, a memory block BLK0 (see FIG. 1) is illustrated as an example, and the above-described reference cell is included in the memory block BLK0.

Referring to FIG. 20, normal memory cells NC are connected between word lines WL0 through WLn and bit lines BL0 through BLm. In addition, dummy memory cells DC are connected between dummy bit lines DBL0 through DBL2 and the word lines WL0 through WLn. A reference cell RC may be connected between the dummy bit line DBL0 and the word line WLk.

The normal memory cells NC are cells in which data is stored. The shape of the dummy memory cells DC may be identical to that of the normal memory cells NC. However, the dummy memory cells DC are cells in which no data is stored. As described above, the reference cell RC is a cell used to adjust the amount of compensation current or clamping current by reflecting temperature changes.

As illustrated in FIG. 20, the reference cell RC may be located approximately in the middle of the dummy bit line DBL0 to prevent edge loading.

Referring to FIG. 21, the normal memory cells NC may not be connected to the word line WLk that is connected to the reference cell RC. That is, only the dummy memory cells DC in addition to the reference cell RC may be connected to the word line WLk.

Whenever data stored in all normal memory cells NC in the memory block BLK0 is read, the reference cell RC may also be read. Accordingly, the word line WLk connected to the reference cell RC is very frequently connected to a ground source. Thus, if the normal memory cells NC are connected to the word line WLk, they may be adversely affected. For this reason, the normal memory cells NC may not be connected to the word line WLk that is connected to the reference cell RC.

Figure 22:
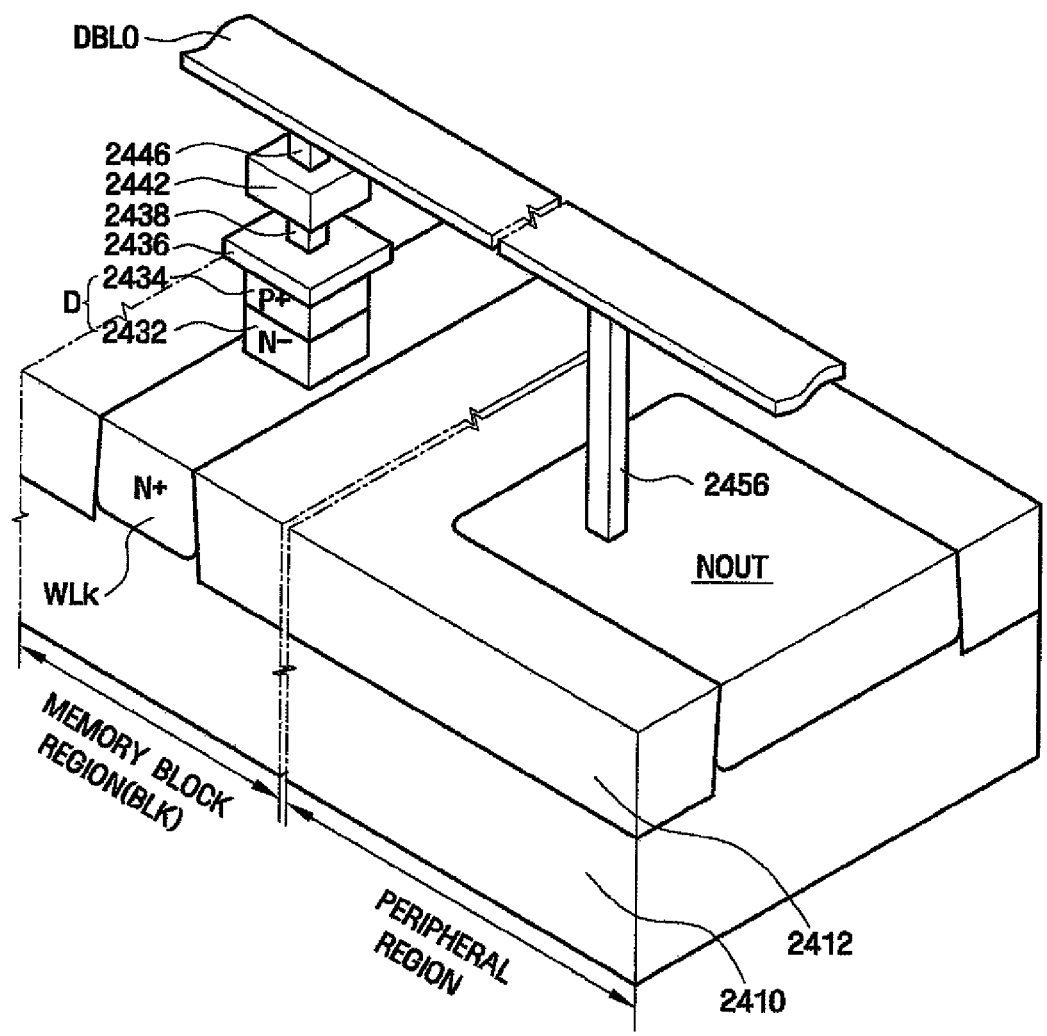
FIG. 22 is a perspective view of a nonvolatile memory device according to a ninth embodiment of the present invention.
Figure 23:
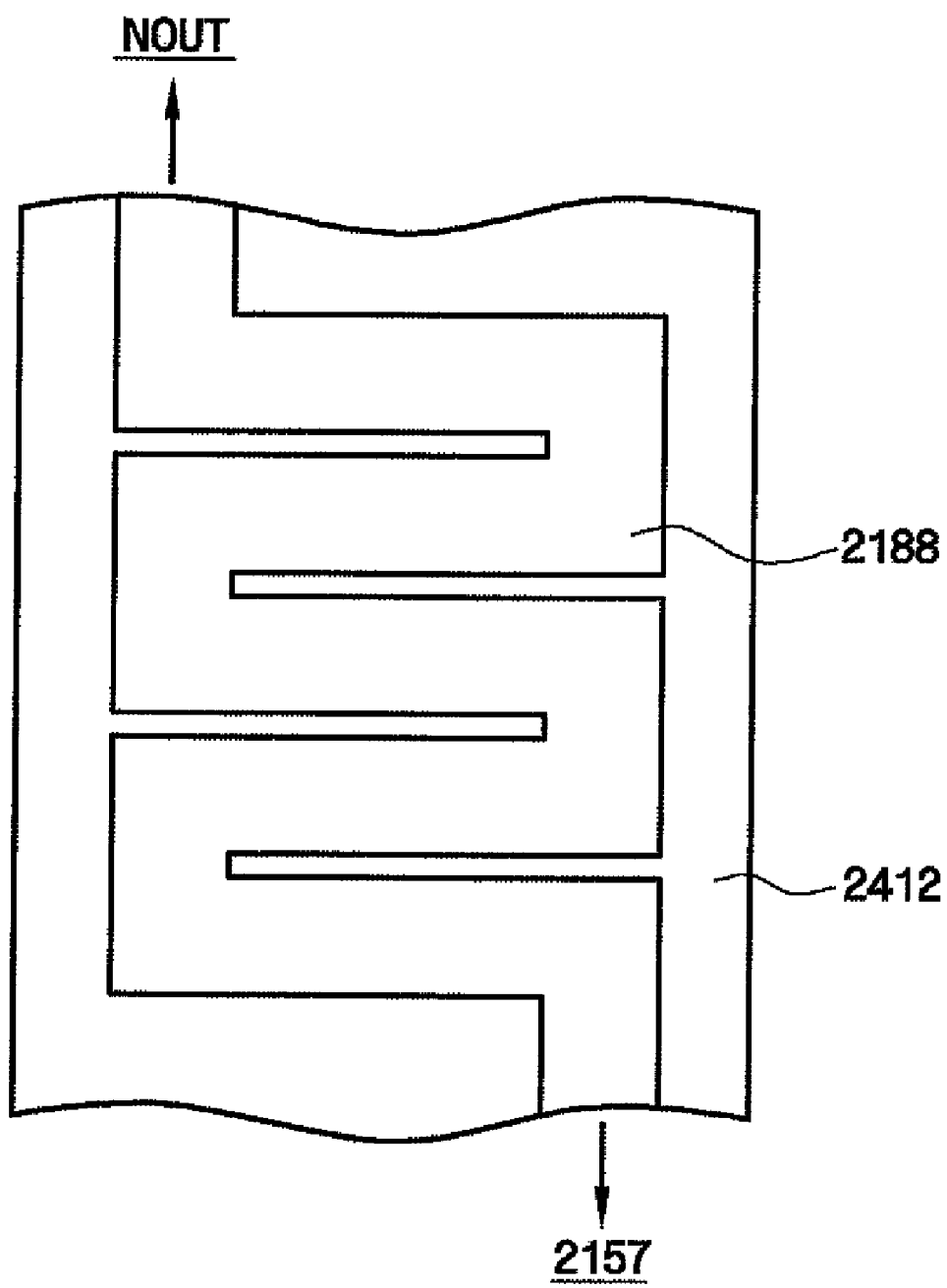
FIG. 23 is a layout diagram of a second resistor 188 included in the nonvolatile memory device according to the ninth embodiment of the present invention.

FIG. 22 is a perspective view of a nonvolatile memory device according to a ninth embodiment of the present invention. FIG. 23 is a layout diagram of a second resistor 2188 included in the nonvolatile memory device according to the ninth embodiment of the present invention.

Referring to FIG. 22, when a reference cell RC is disposed within a memory block BLK0 as described above with reference to FIGS. 20 and 21, a reference write driver 2140 and a reference read circuit 2180 may be disposed in a peripheral region.

Specifically, an element isolation region 2412 is formed on a substrate 2410 of a first conductivity type (e.g., a P type) to define a plurality of active regions. For example, an active region formed in the memory block BLK0 may extend in a first direction. The active region formed in the memory block BLK0 may be implanted with impurities of a second conductivity type (e.g., an N type) to form a word line WLk. The substrate 2410 may be a silicon substrate, a silicon-on-insulator (SOI) substrate, a gallium arsenic substrate, a silicon germanium substrate, or the like.

A method of forming the word line WLk by implanting the substrate 2410 of the first conductivity type with the impurities of the second conductivity type has been described above. However, the present invention is not limited to this method. For example, the word line WLk may also be formed by epitaxial growth on the substrate 2410.

A first semiconductor pattern 2432 and a second semiconductor pattern 2434 are formed on the word line WLk to form a diode D. To form the first and second semiconductor patterns 2432 and 2434, for example, a mold pattern may be formed on the substrate 2410, and then a semiconductor pattern may be formed along the mold pattern using selective epitaxial growth or solid phase epitaxial (SPE) growth. Then, an ion implantation process may be performed.

An ohmic contact layer 2436 is formed on the diode D. The ohmic contact layer 2436 may be made of metal such as tungsten. In addition, the ohmic contact layer 2436 may be formed by physical vapor deposition (PVD), chemical vapor deposition (CVD), atomic layer deposition (ALD), or the like.

A bottom electrode contact 2438 is formed on the ohmic contact layer 2436. The bottom electrode contact 2438 may be made of a material selected from TiN, TiAlN, TaN, WN, MoN, NbN, TiSiN, TiBN, ZrSiN, WSiN, WBN, ZrAlN, MoAlN, TaSiN, TaAlN, TiW, TiAl, TiON, TiAlON, WON, and TaON.

A phase-change material 2442 is formed on the bottom electrode contact 2438.

A top electrode contact 2446 is formed on the phase-change material 2442. The top electrode contact 2446 may be omitted when necessary.

A dummy bit line DBL0 is formed on the top electrode contact 2446 and extends in a second direction which is different from the first direction. That is, the word line WLk and the dummy bit line DBL0 may intersect each other. The dummy bit line DBLO may extend up to the peripheral region. The dummy bit line DBL0 may contain aluminum, copper, or the like. For example, the dummy bit line DBL0 may be a lowest metal wiring layer.

A specified active region (a region corresponding to an output node NOUT) in the peripheral region may be connected to the dummy bit line DBLO by a contact 2456. Unlike the illustration in FIG. 22, the contact 2456 may include a plurality of contacts that are stacked in a vertical direction.

The second resistor 2188 may be implemented in various ways. For example, referring to FIG. 23, the second resistor 2188 may be implemented by forming an active region in a zigzag pattern in the substrate 2410. That is, the second resistor 2188 may be implemented in an active region between a region in which the output node NOUT is implemented and a region in which a seventh transistor 2157 is to be formed. When this zigzag pattern is repeated a number of times, a physical length of the active region can be increased. Thus, the resistance of the second resistor 2188 can be easily adjusted.

Figure 24:
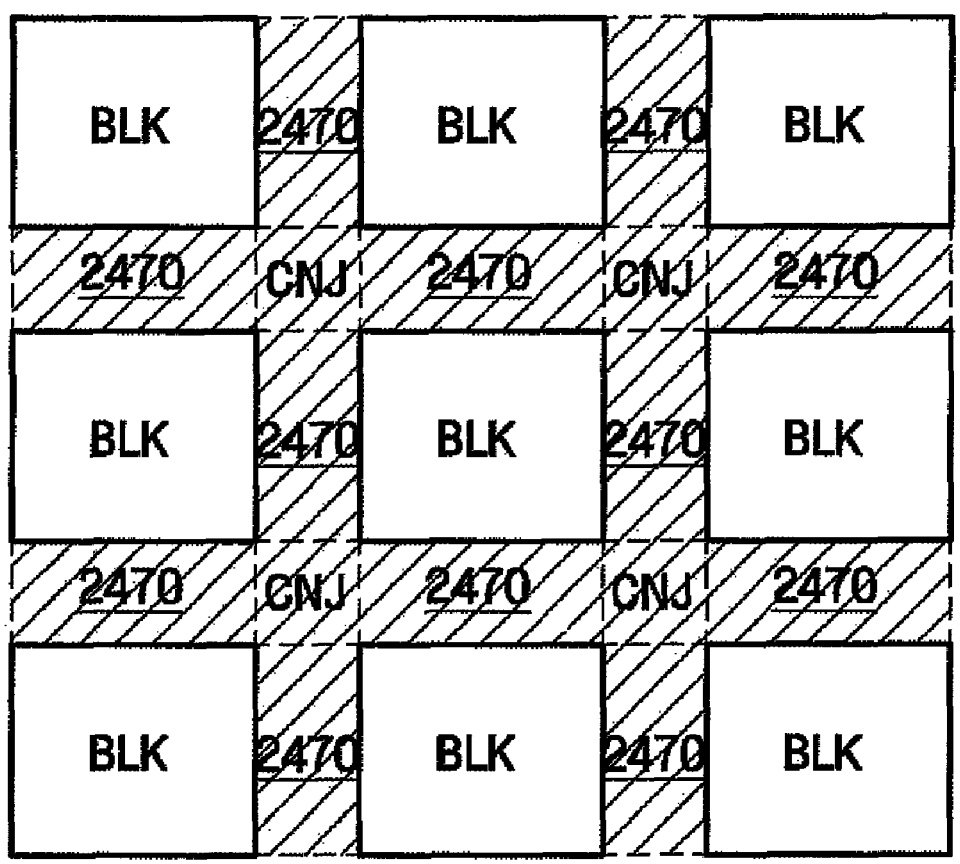
FIG. 24 is a layout diagram of a nonvolatile memory device according to a tenth embodiment of the present invention.
Figure 25:
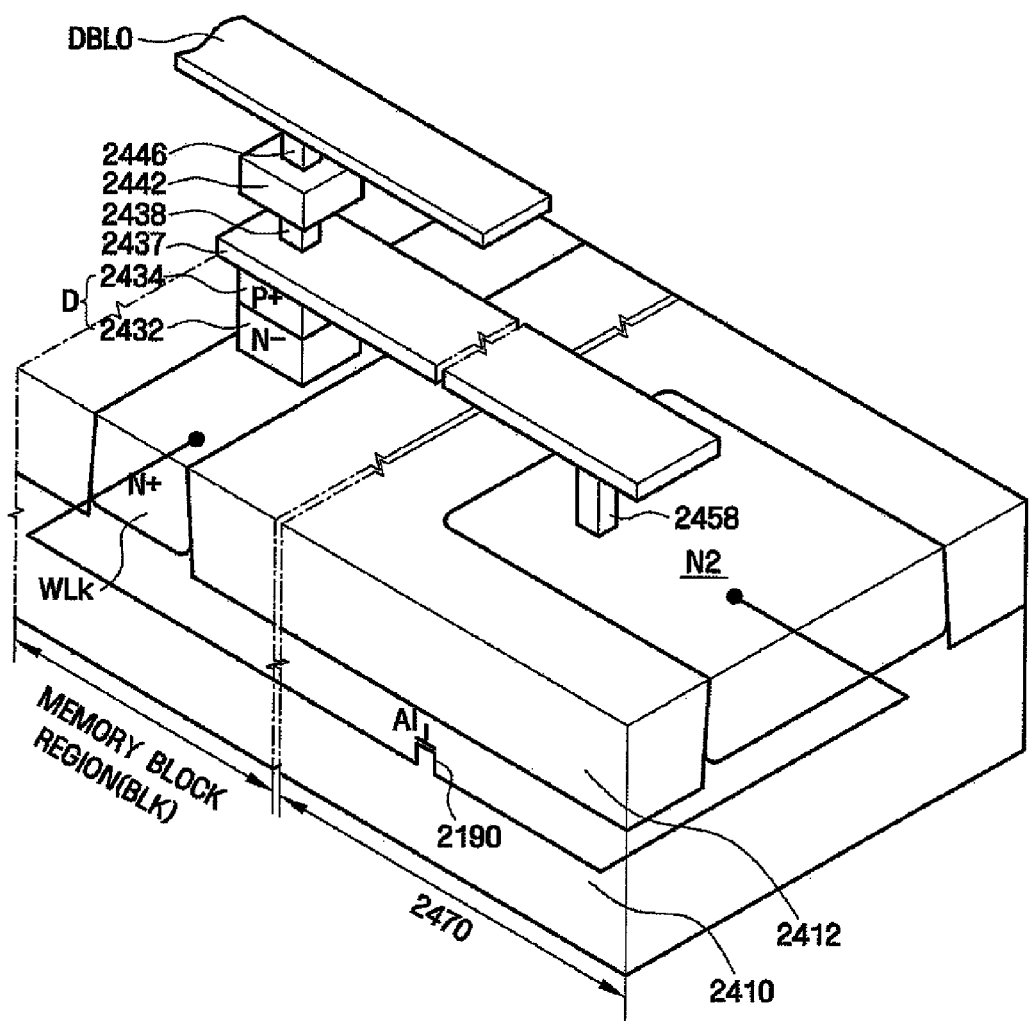
FIG. 25 is a perspective view of the nonvolatile memory device according to the tenth embodiment of the present invention.

FIG. 24 is a layout diagram of a nonvolatile memory device according to a tenth embodiment of the present invention. FIG. 25 is a perspective view of the nonvolatile memory device according to the tenth embodiment of the present invention. The illustrations in FIGS. 24 and 25 may be for implementing the circuit (which further includes the bypass circuit 2190) illustrated in FIG. 17.

Referring to FIG. 24, a plurality of memory blocks BLK are arranged in a 3×3 matrix. Regions 2470, in each of which a local column select circuit is disposed, may be located between the memory blocks BLK, and a conjunction region CNJ may be located between neighboring ones of the regions 2470.

In the tenth embodiment of the present invention, a reference cell RC may be disposed in each memory block BLK, and a bypass circuit 2190 may be disposed in each region 2470 in which the local column select circuit is located or in the conjunction region CNJ.

In FIG. 25, the bypass circuit 2190 is implemented in each region 2470. Referring to FIG. 25, an ohmic contact layer 2437 connected to the reference cell RC may extend from a memory block region to each of the regions 2470. A node N2 implemented in an active region, which is defined in each region 2470, and the ohmic contact layer 2437 are connected to each other by a contact 2458.

The bypass circuit 2190 is formed in each region 2470 and connected between the node N2 and the word line WLk.

Figure 26A:
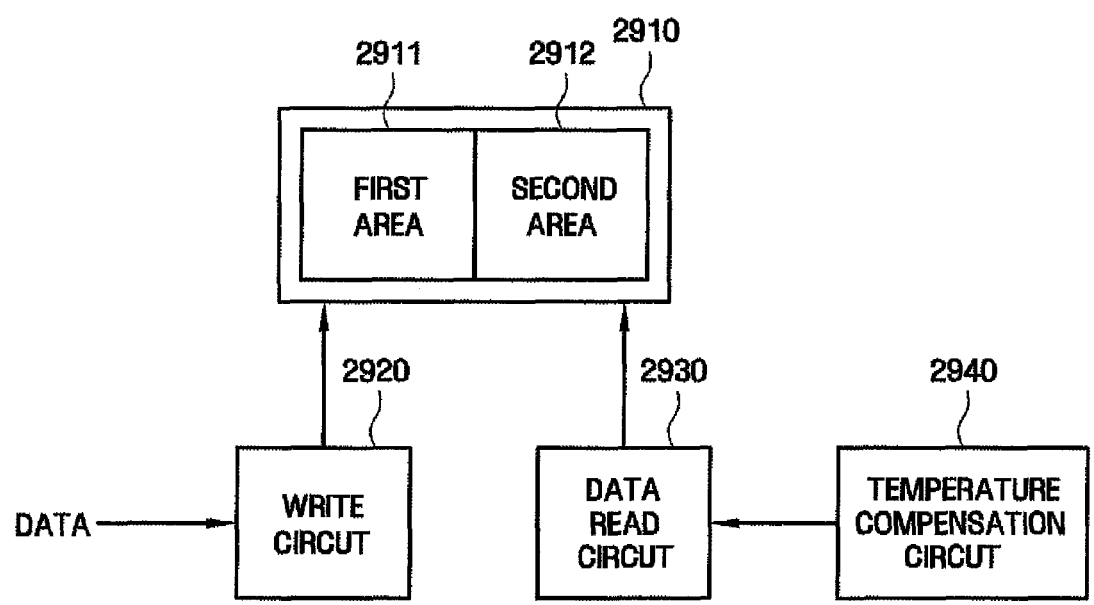
FIG. 26A is a diagram for explaining a variable resistance memory device according to an eleventh embodiment of the present invention.

FIG. 26A is a diagram for explaining a variable resistance memory device according to an eleventh embodiment of the present invention.

Referring to FIG. 26A, the variable resistance memory device may include a cell array 2910, a temperature compensation circuit 2940, a data read circuit (for verification) 2930, and a write circuit 2920.

The memory cell array 2910 includes a plurality of resistance memory cells and is divided into a first area 2911 and a second area 2912 which are different from each other. That is, the memory cell array 2910 may be divided into a plurality of areas, depending on what it is used for. The first area 2911 may have a shorter response time and a faster access time than the second area 2912. In addition, the first area 2911 may replace a main memory, and the second area 2912 may replace a hard disk drive (HDD).

As described above, the temperature compensation circuit 2940 may include one or more reference cells.

As described above, the data read circuit 2930 may perform a verifying-read operation by supplying a current, which changes according to the resistance of the reference cells, to one or more of the resistance memory cells.

The write circuit 2920 examines data provided by an external source and writes the data to the first area 2911 or the second area 2912 based on the examination result. The data provided by the external source may include a code, which indicates whether the data must be stored in the first area 2911 or the second area 2912, in a data header. Therefore, the write circuit 2920 may examine the code and determine whether to write the data to the first area 2911 or the second area 2912.

The second area 2912 may have a hierarchical structure described above in the first through fourth embodiments. The variable resistance memory device may include a global bit line, which is connected to a write circuit and a data read circuit, one or more local bit lines, which are coupled to the resistance memory cells disposed in the second area 2912, and a plurality of column select transistors. Here, each of the column select transistors may selectively connect the global bit line to any one of the local bit lines.

The resistance of a column select transistor located far from the write circuit and the data read circuit may be smaller than that of a column select transistor located close to the write circuit and the data read circuit. Alternatively, the column select transistor located far from the write circuit and the data read circuit may be larger than the column select transistor located close to the write circuit and the data read circuit. The doping concentration of a channel region of the column select transistor located far from the write circuit and the data read circuit may be higher than that of a channel region of a column select transistor located close to the write circuit and/or the data read circuit.

The first area 2911 or the second area 2912 may include a temperature compensation circuit which includes a reference cell and which has been described above in the fifth through tenth embodiments. Therefore, a verifying-read operation may be performed by supplying a current, which changes according to the resistance of one reference cell, to one or more of the resistance memory cells.

Figure 26B:
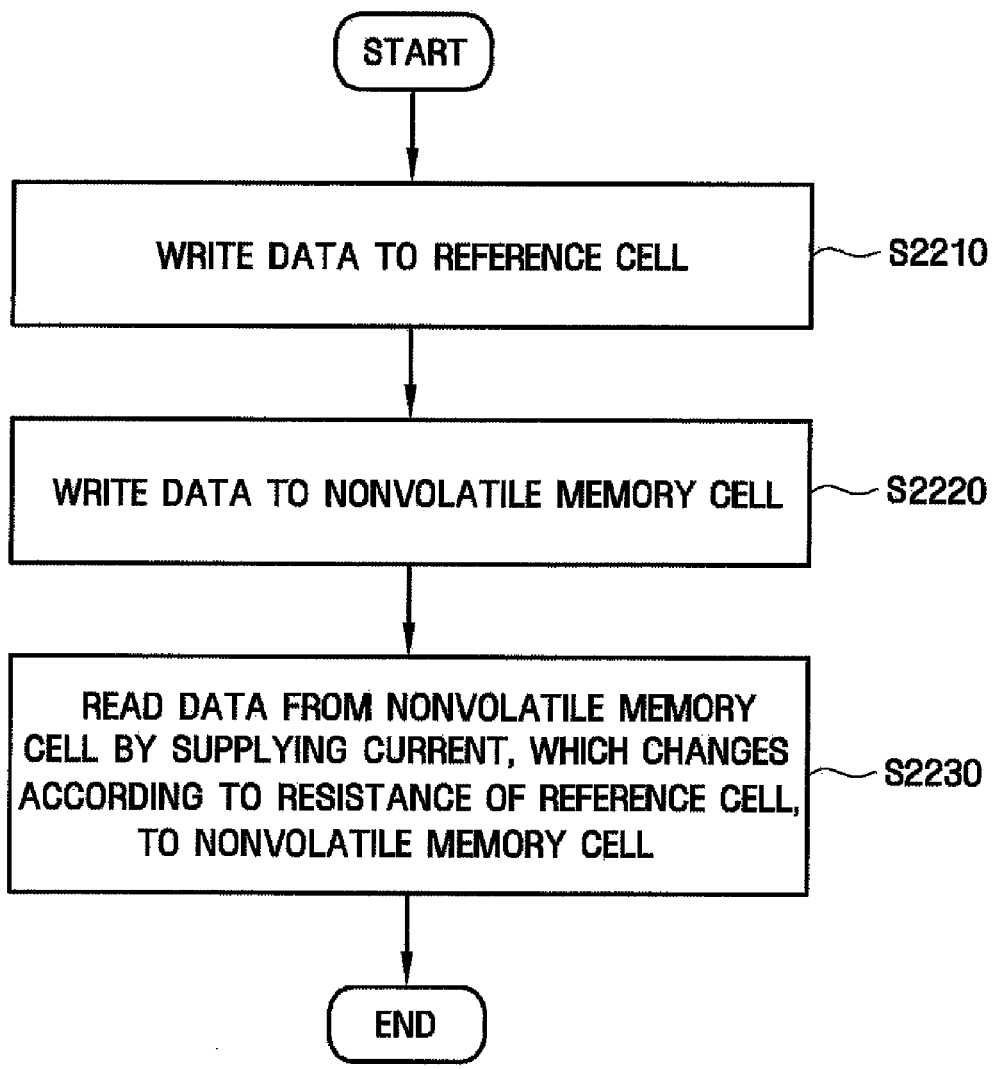
FIG. 26B is a flowchart illustrating a method of driving the nonvolatile memory devices according to the fifth and seventh embodiments of the present invention.

FIG. 26B is a flowchart illustrating a method of driving the nonvolatile memory devices according to the fifth and seventh embodiments of the present invention.

Referring to FIGS. 14 and 26B, a memory cell array, which includes m bit-level cells ("m" is a natural number), and a reference set, which includes $2^m-1$ reference cells, are provided.

The resistance of the reference cells is read.

The $2^m-1$ reference cells included in one reference set are written such that the $2^m-1$ reference cells respectively have different resistance distributions (operation S2210).

For example, when the m bit-level cells are 2 bit-level cells, there may be three ($=2^2-1$) reference cells, and the three reference cells may respectively store resistance values corresponding to resistance distributions Ref1 through Ref3.

Data is written to the m bit-level cells (operation S2220).

Then, a current, which changes according to the resistance of the $2^m-1$ reference cells, is supplied to the m bit-level cells to verifying-read data from the m bit-level cells (operation S2230).

For example, a compensation current, which changes according to a resistance value corresponding to each of the resistance distributions Ref1 through Ref3 sequentially, is supplied to the m bit-level cells in order to verifying-read data.

Application Embodiments

FIGS. 27 through 31 are diagrams for explaining storage systems according to first through fifth embodiments of the present invention. Specifically, FIGS. 27 through 31 illustrate storage systems using the nonvolatile memory devices according to the fifth through tenth embodiments of the present invention.

Figure 27:
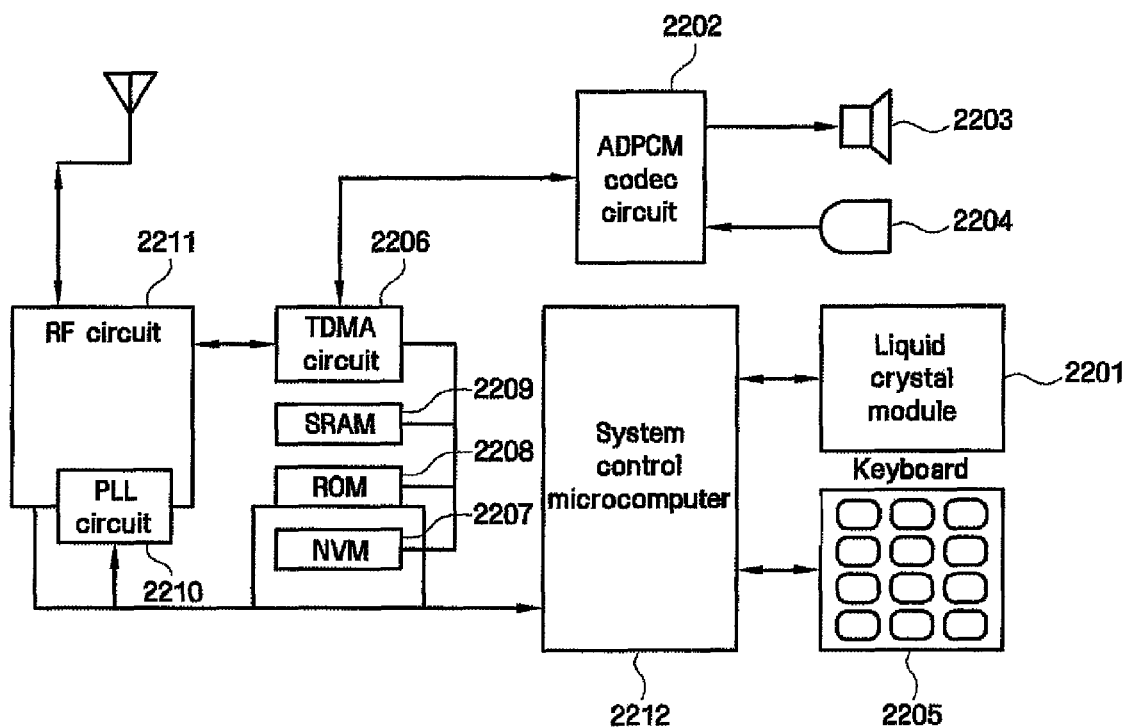
FIGS. 27 through 31 are diagrams for explaining storage systems according to first through fifth embodiments of the present invention.

FIG. 27 is a diagram illustrating a cellular phone system that uses nonvolatile memory devices according to embodiments of the present invention.

Referring to FIG. 27, the cellular phone system may include an adaptive differential pulse code modulation (AD-PCM) codec circuit 2202 which compresses sound or decompresses compressed sound, a speaker 2203, a microphone 2204, a time division multiplex access (TDMA) circuit 2206 which time-division multiplexes digital data, a phase-locked loop (PLL) circuit 2210 which sets a carrier frequency of a wireless signal, and a radio frequency (RF) circuit 2211 which transmits or receives a wireless signal.

In addition, the cellular phone system may include various types of memory devices. For example, the cellular phone system may include a nonvolatile memory device 2207, a read only memory (ROM) 2208, and a static random access memory (SRAM) 2209. The nonvolatile memory device 2207 may be any one of the nonvolatile memory devices according to the embodiments of the present invention and may store, for example, an identification (ID) number. The ROM 2208 may store programs, and the SRAM 2209 may serve as a work area for a system control microcomputer 2212 or temporarily store data. The system control microcomputer 2212 is a processor and may control a write operation and a read operation of the nonvolatile memory device 2207.

Figure 28:
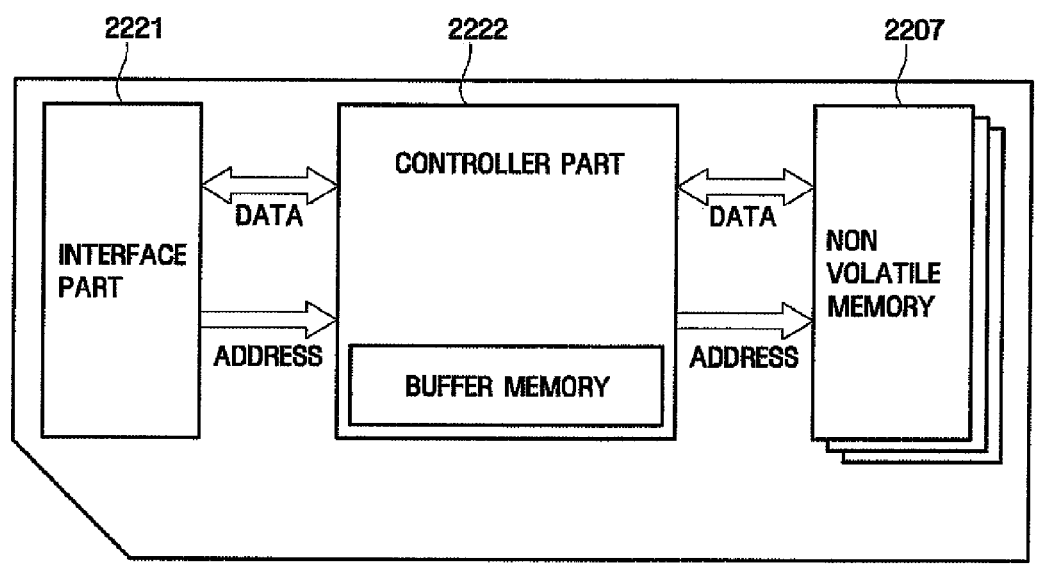

FIG. 28 is a diagram illustrating a memory card which uses nonvolatile memory devices according to embodiments of the present invention. The memory card may be, for example, a multimedia card (MMC), a secure digital (SD) card, a multiuse card, a micro SD card, a memory stick, a compact SD card, an ID card, a personal computer memory card international association (PCMCIA) card, a solid-state drive (SSD) card, a chip card, a smart card, or a universal serial bus (USB) card.

Referring to FIG. 28, the memory card may include an interface part 2221 which interfaces with an external device, a controller part 2222 which includes a buffer memory and controls the operation of the memory card, and one or more nonvolatile memories 2207 according to embodiments of the present invention. The controller part 2222 is a processor and may control the write and read operations of the nonvolatile memories 2207. Specifically, the controller part 2222 is coupled to each of the interface part 2221 and the nonvolatile memory devices 2207 by a data bus DATA and an address bus ADDRESS.

Figure 29:
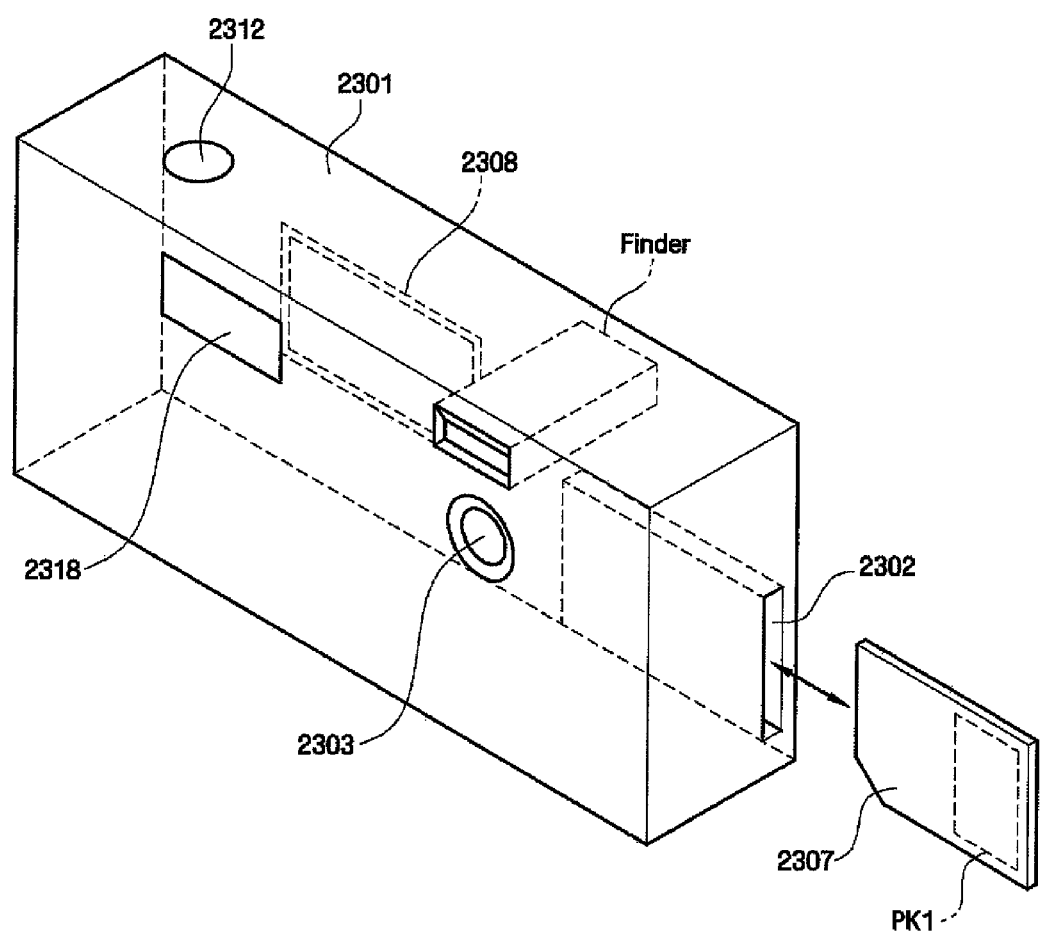

FIG. 29 is a diagram illustrating a digital still camera that uses nonvolatile memory devices according to embodiments of the present invention.

Referring to FIG. 29, the digital still camera includes a body 2301, a slot 2302, a lens 2303, a display 2308, a shutter button 2312, and a strobe 2318. In particular, a memory card 2307 may be inserted into the slot 2302 and include one or more nonvolatile memory devices PK1 according to embodiments of the present invention.

If the memory card 2307 is of a contact type, it electrically contacts a specified electrical circuit on a circuit board when it is inserted into the slot 2302. When the memory card 2331 is of a non-contact type, it communicates with the memory card 2307 using a wireless signal.

Figure 30:
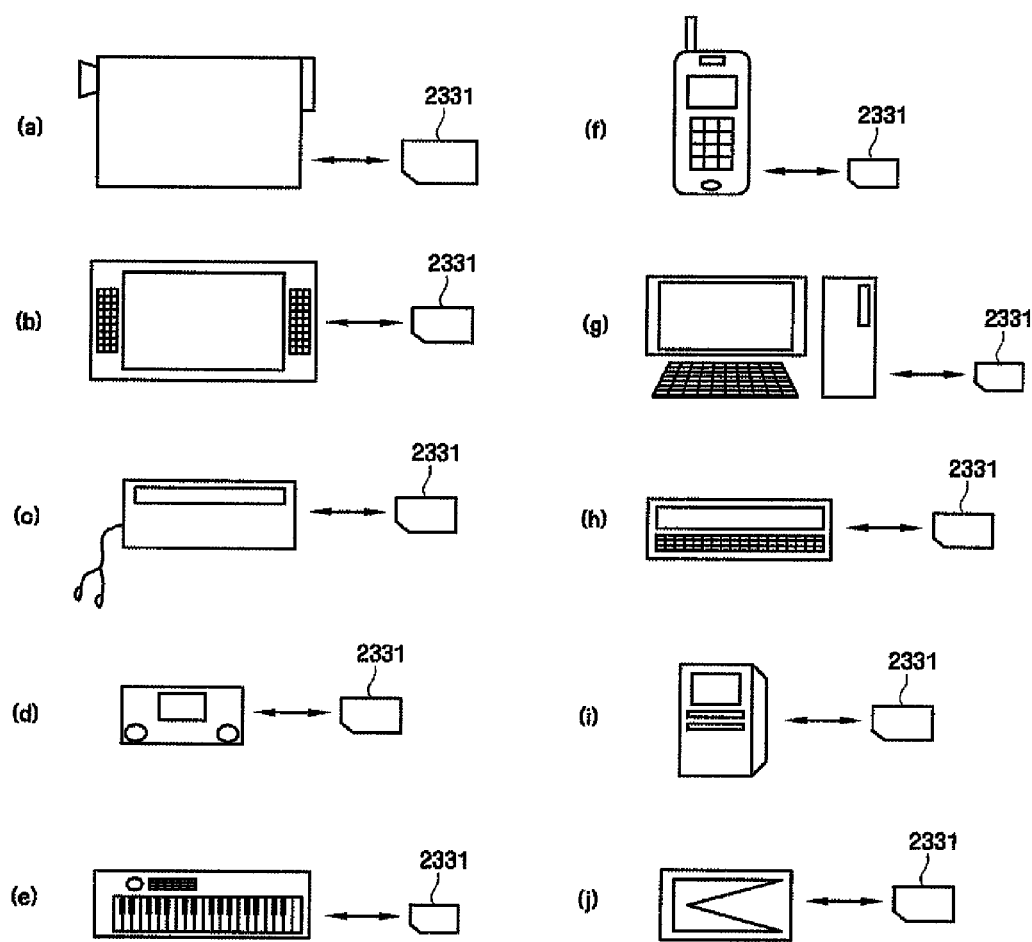

FIG. 30 is a diagram illustrating various systems that use the memory card of FIG. 28.

Referring to FIG. 30, a memory card 2331 may be used in (a) a video camera, (b) a television, (c) an audio device, (d) a game device, (e) an electronic music device, (f) a mobile phone, (g) a computer, (h) a personal digital assistant (PDA), (i) a voice recorder, and (j) a personal computer (PC) card.

Figure 31:
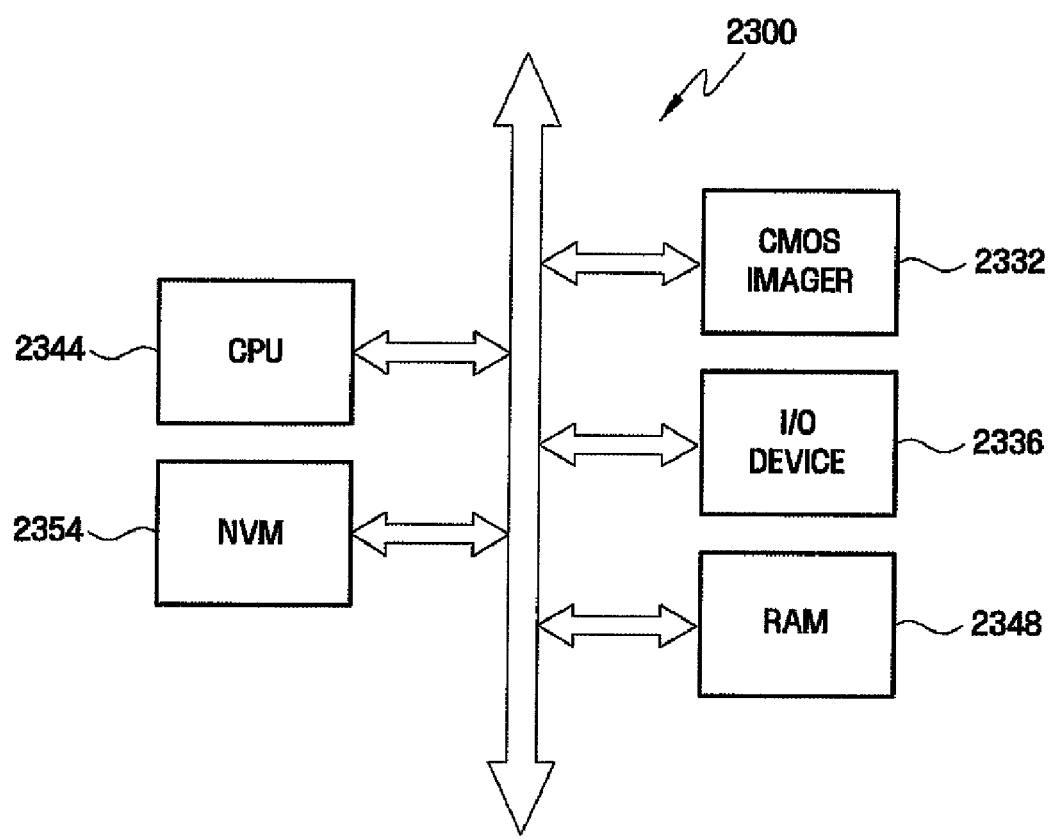

FIG. 31 is a diagram illustrating an image sensor system that uses nonvolatile memory devices according to embodiments of the present invention.

Referring to FIG. 31, the image sensor system may include an imager 2332, an input/output device 2336, a random access memory (RAM) 2348, a central processing unit (CPU) 2344, and a nonvolatile memory device 2354 according to embodiments of the present invention. These components, i.e., the imager 2332, the input/output device 2336, the RAM 2348, the CPU 2344, and the nonvolatile memory device 2354 communicate with each other using a bus. The imager 2332 may include a photo sensing element such as a photogate or a photodiode. Each of the above components and a processor may be implemented as a single chip or separate chips.

Figure 32:
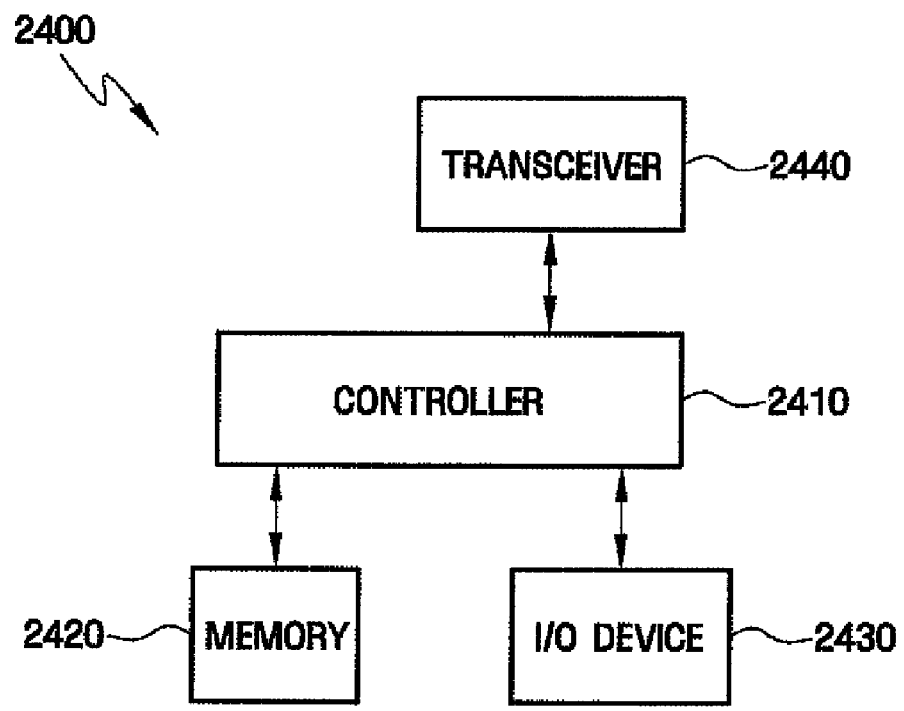
FIG. 32 is a schematic block diagram of a portable media system including phase-change random access memory device according to embodiments of the present invention.

FIG. 32 is a schematic block diagram of a portable media system including phase-change random access memory device according to embodiments of the present invention. In an embodiment of the present invention, a mobile phone as the portable media system is described by way of example, but the invention is not limited thereto. Rather, the invention may also be applied to a two-way communications system, a one-way pager, a two-way pager, a personal communications system, a portable computer, a personal data assistance (PDA), an MPEG audio layer-3 (MP3) player, a digital camera, and other electronic devices.

Referring to FIG. 32, the portable media system 2400 includes a controller 2410, a memory unit 2420, an I/O device 2430, and a transceiver 2440.

The controller 2410 may, for example, include microprocessors, digital signal processors, microcontrollers, and the like.

The memory 2420 stores messages transmitted to the portable media system 2400 or an external device. That is to say, the memory 2420 stores data or instructions executed by the controller while the portable media system 2400 is operating. The memory 2420 is composed of one or more different kinds of memories. For example, the memory 2420 may be a volatile memory device, or a nonvolatile memory device such as a flash memory device and/or a phase-change memory device. Here, usable examples of the phase-change memory device include PRAMs according to preferred embodiments of the present invention.

In particular, the most challenging task of the portable media system 2400 is to minimize the amount of current consumed. As described in the foregoing embodiments of the present invention, the current and power consumption can be minimized by decreasing resistance of a column select transistor in a phase-change memory cell far away from a write and/or read circuit, thereby improving reliability during write and/or read operation.

The portable media system 2400 may transmit or receive messages in a wireless manner through the transceiver 2440 connected to an antenna (not shown). Here, the portable media system 2400 may transmit or receive messages using protocols such as CDMA (Code Division Multiple Access), GSM (Global System for Mobile communication), NADC (North 20 American Digital Cellular), TDMA (Time Division Multiple Access), ETDMA (Extended TDMA), third-generation WCDMA(Wideband CDMA), CDMA-2000, etc.

The I/O device 2430 generates a message by user's manipulation. The I/O device 2430 may comprise a keypad, a monitor, and the like.

A phase-change random access memory device of the present invention provides at least one of the following advantages. First, the phase-change random access memory device of the present invention can prevent failures during write and/or read operations. Second, the phase-change random access memory device provides a phase-change memory cell in which a reset state can be written surely, and whereby the resistance margin of the phase-change memory cells increase by reducing a distribution of set resistance, which improves the reliability of phase-change memory cells. Third, the phase-change random access memory device can decrease the level of write current and/or read current, thereby reducing current consumption.

Figure 33:
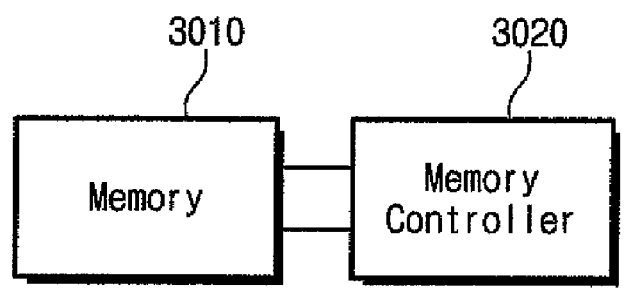
FIG. 33 through FIG. 40 illustrate an example embodiment of an application of the semiconductor device.

FIG. 33 illustrates an example embodiment of an application of the semiconductor device. As shown, this embodiment includes a memory 3010 connected to a memory controller 3020. The memory 3010 may be any of the semiconductor device embodiments described above. The memory controller 3020 supplies the input signals for controlling operation of the memory 3010. For example, the memory controller 3020 supplies the command CMD and address signals. The memory controller 3020 may include a memory interface, a host interface, an ECC circuit, a central processing unit (CPU), and a buffer memory. The memory interface provides data transmitted from the buffer memory to the memory 3010 or transmits data read out of the memory 3010 to the buffer memory. Also the memory interface may provide a command or an address transmitted from an external host to the memory 3010.

The host interface may communicate with an external host through USB (Universal Serial Bus), SCSI (Small Computer System Interface), PCI express, ATA, PATA (Parallel ATA), SATA (Serial ATA), SAS (Serial Attached SCSI).

A memory system according to embodiments of the present invention may include an ECC circuit, which generates a parity bit using data transmitted to a memory 3010. The generated parity bit may be stored in a specific area of the memory 3010, together with data. The ECC circuit detects an error of data read out of the memory 3010. If the detected error is within a correction range, the ECC circuit corrects the detected error.

The CPU processes a signal input from the external host after analyzing the input signal. The CPU controls the external host or the memory 3010 through the host interface or the memory interface. The CPU may control write, read, and erase operations depending on firmware for driving a memory.

The buffer memory temporarily stores write data provided from the external host or data read out of the memory 3010. Also the buffer memory may store meta data or cache data to be stored in the memory 3010. During a sudden power-off operation, meta data or cache data stored in the buffer memory may be stored in the memory 3010. The buffer memory may include a DRAM and an SRAM.

Figure 34:
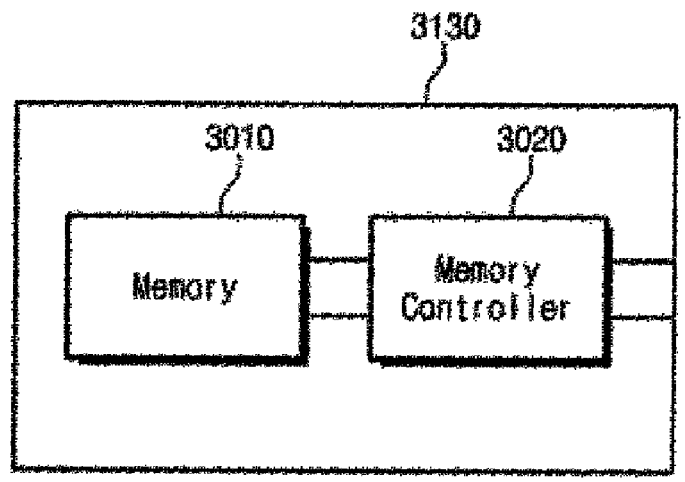

FIG. 34 illustrates yet another embodiment. This embodiment is the same as the embodiment of FIG. 33, except that the memory 3010 and memory controller 3020 have been embodied as a card 3130. For example, the card 3130 may be a memory card such as a flash memory card. Namely, the card 3130 may be a card meeting any industry standard for use with a consumer electronics device such as a digital camera, personal computer, etc. It will be appreciated that the memory controller 3020 may control the memory 3010 based on controls signals received by the card 3130 from another (e.g., external) device.

Figure 35:
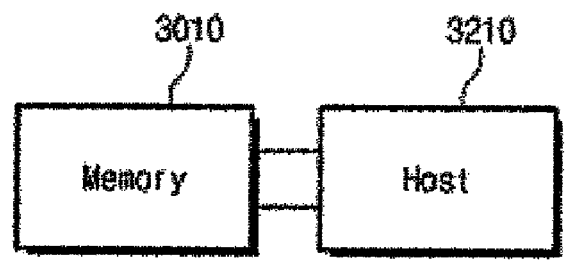

FIG. 35 illustrates a still further embodiment of the present invention. As shown, the memory 3010 may be connected with a host system 3210. The host system 3210 may be a processing system such as a personal computer, digital camera, etc. The host system 3210 may use the memory 3010 as a removable storage medium. As will be appreciated, the host system 3210 supplies the input signals for controlling operation of the memory 3010. For example, the host system 3210 supplies the command CMD and address signals.

Figure 36:
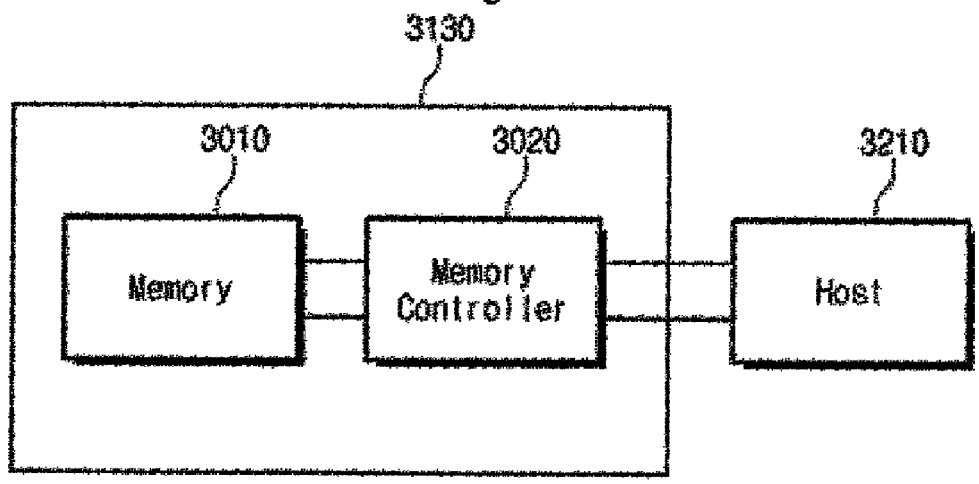

FIG. 36 illustrates an embodiment of the present invention in which the host system 3210 is connected to the card 3130. In this embodiment, the host system 3210 applies control signals to the card 3130 such that the memory controller 3020 controls operation of the memory 3010.

Figure 37:
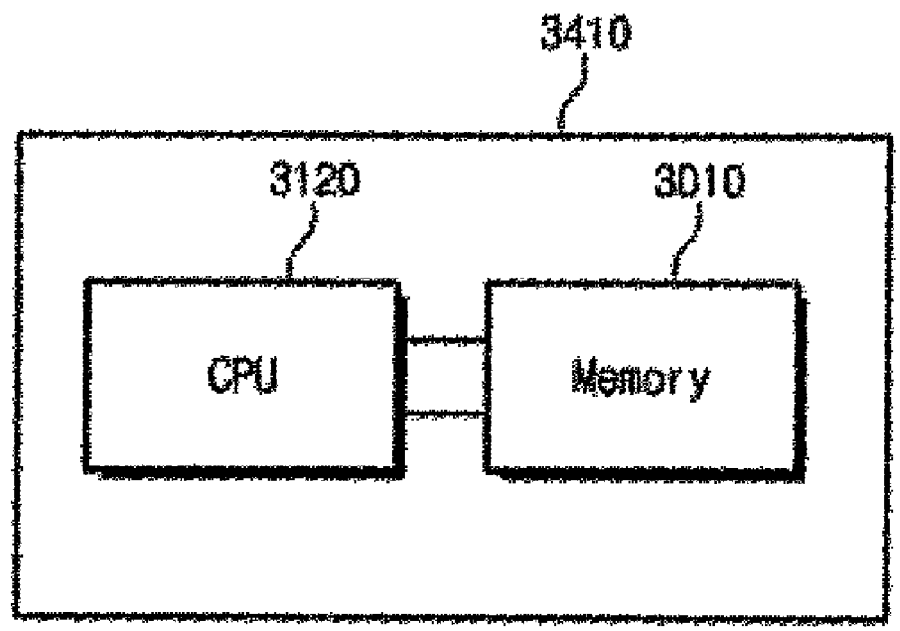

FIG. 37 illustrates a further embodiment of the present invention. As shown, the memory 3010 may be connected to a central processing unit (CPU) 3120 within a computer system 3410. For example, the computer system 3410 may be a personal computer, personal data assistant, etc. The memory 3010 may be directly connected with the CPU 3120, connected via a bus, etc. It will be appreciated, that FIG. 37 does not illustrate the full complement of components that may be included within a computer system 3410 for the sake of clarity.

A semiconductor device according to some embodiments of the present invention may be used as a storage class memory (SCM), which is the general concept of memories capable of simultaneously providing nonvolatile characteristics and access characteristics. The storage class memory may be utilized as not only a data storage region but also a program performing region. Also, the storage class memory may be utilized as not only a main memory but also a mass storage.

Also, the memory cell array of some embodiments of the present invention may be data storage region.

The above-described PRAM, FeRAM, and MRAM may be appropriate examples of a storage class memory. Such a storage class memory may be used as not only a data storage memory instead of a flash memory but also a main memory instead of an SRAM. Moreover, one storage class memory may be used instead of a flash memory and an SRAM.

Figure 38:
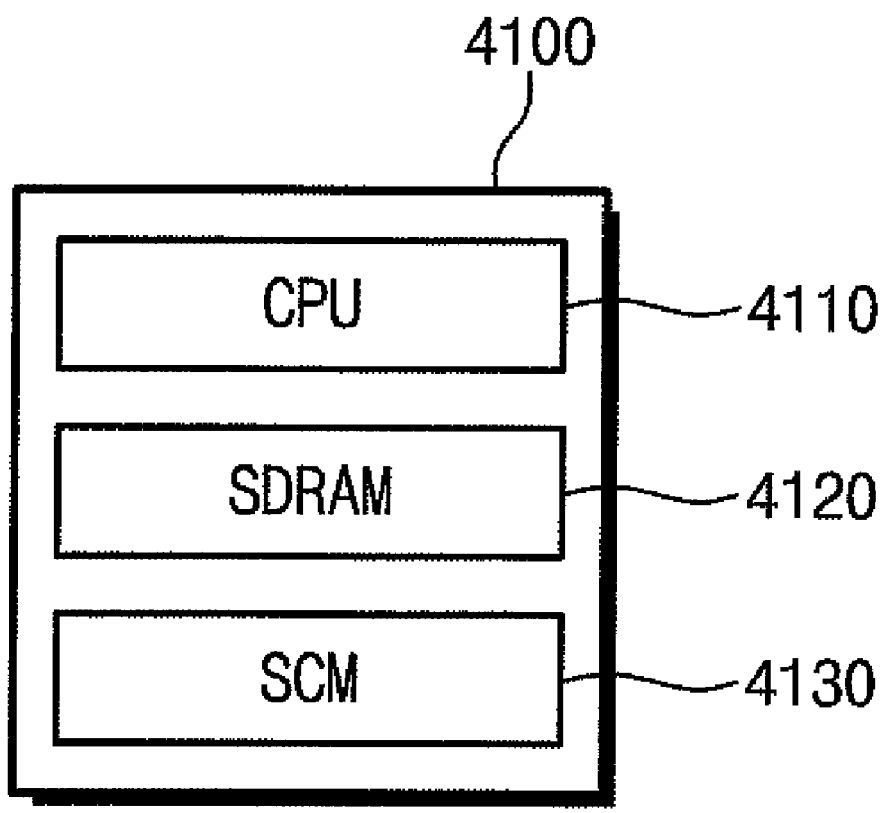

FIG. 38 illustrates an exemplary configuration of a memory system 4100 in which a storage class memory (SCM) is used instead of a storage class memory. As illustrated, the memory system 4100 includes a CPU 4110, an SDRAM 4120, and an SCM 4130 used instead of a flash memory.

In the memory system 4100, data access speed of the SCM 4130 is higher than that of a flash memory. For example, under a PC environment where the CPU 4110 runs at 4 GHz, data access speed of a PRAM which is a kind of the SCM 4130 is about 32 times higher than that of a flash memory. Thus, the memory system 4100 equipped with the SCM 4130 may attain higher-speed access gain than a memory system equipped with a flash memory.

Figure 39:
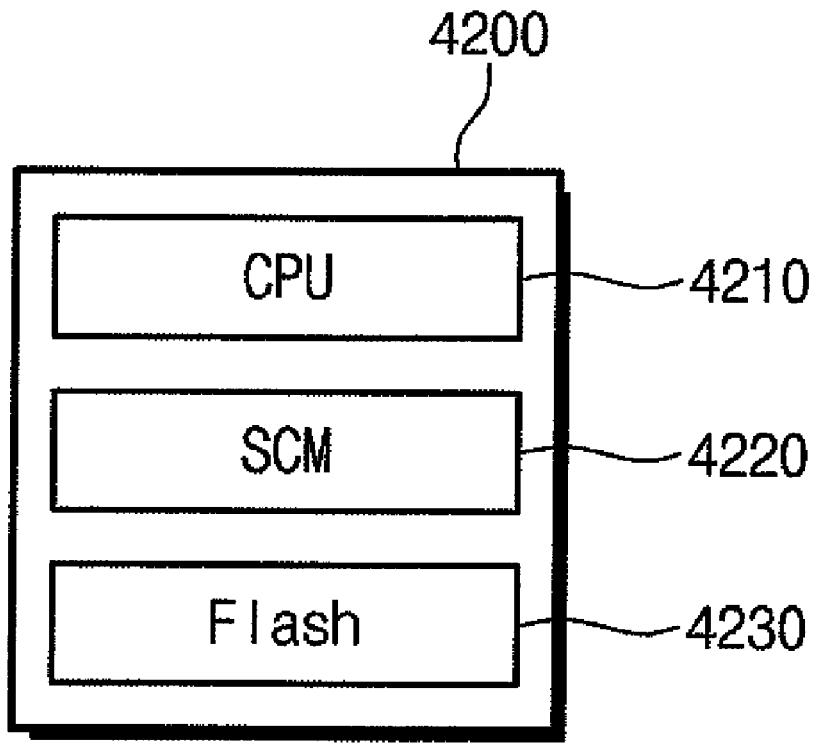

FIG. 39 illustrates an exemplary configuration of a memory system 4200 in which an SCM is used instead of an SDRAM. As illustrated, the memory system 4200 includes a CPU 4210, an SCM 4220, and a flash memory 4230. The SCM 4220 is used as a main memory instead of an SDRAM.

In the memory system 4200, power dissipation of the SCM 4220 is lower than that of an SDRAM. Energy dissipated by a main memory of a computer system amounts to about 40 percent of total energy. Therefore, many efforts have been intensively made to reduce power dissipation of a main memory. An SCM may reduce dynamic energy dissipation to an average of about 53 percent and reduce energy dissipation caused by power leakage to an average of about 73 percent. As a result, the memory system 4200 equipped with the SCM 4220 may allow power dissipation to be reduced more than a memory system equipped with an SDRAM.

Figure 40:
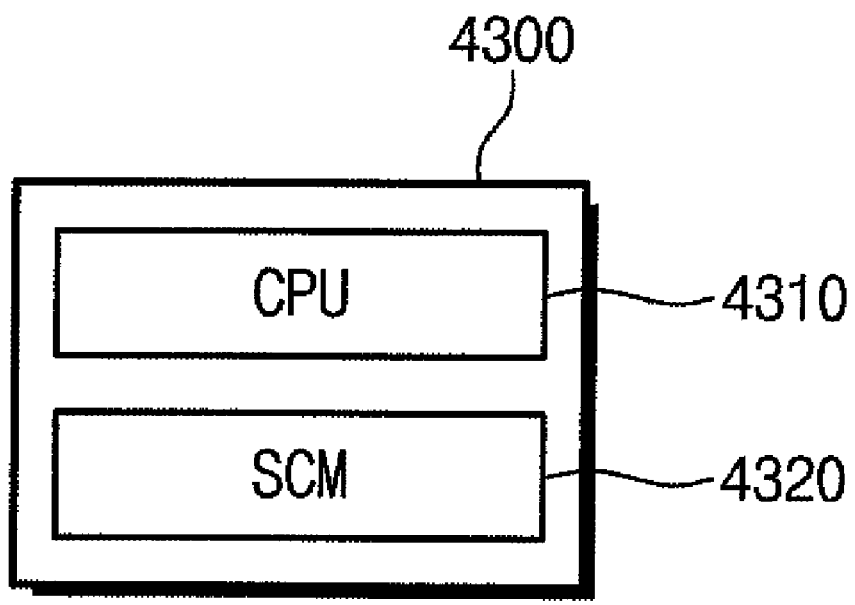

FIG. 40 illustrates an exemplary configuration of a memory system 4300 in which an SCM is substituted for an SDRAM as well as a flash memory. As illustrated, the memory system 4300 includes a CPU 4310 and an SCM 4320. The SCM 4320 is used as a main memory instated of an SDRAM and as a data storage memory instead of a flash memory. This memory system 4300 is advantageous in data access speed, low power, space utilization, and costs.

A variable resistance memory device according to an embodiment of the present invention can be applied to a server SSD. U.S Patent Publication Nos. 2008/0256292, 2008/0256183, and 2008/0168304 disclose in FIG. 1A and the corresponding detailed description thereof that a solid-state storage 110 includes a PRAM, a flash, an MRAM, an NRAM, and a DRAM and that a solid-state storage device 102 includes a solid-state storage controller 104 and a solid-state storage 110. In addition, U.S Patent Publication Nos. 2008/0256292, 2008/0256183, and 2008/0168304 disclose a solid-state memory and a controller, which process the speed of a high-speed interface, and a redundant array of independent drives (RAIDs) in a solid-state device, and are incorporated by reference herein in their entirety.

Meanwhile, U.S. Pat. No. 6,242,605, U.S Patent Publication Nos. 2007/0236987 and 2008/0123389, and U.S. patent application Ser. No. 12/461,036, and Korean Patent Application No. 2009-0066990 are incorporated and combined in the present specification.

Although the invention has been described in connection with the exemplary embodiments, it will be apparent to those skilled in the art that various modifications and changes may be made thereto without departing from the scope of the present invention. Therefore, it should be understood that the above embodiments are not limitative, but illustrative in all aspects. The scope of the invention is defined by the appended claims, and all changes and modifications that fall within meets and bounds of the claims, or equivalents of such meets and bounds are therefore intended to be embraced by the claims.

What is claimed is:

1. A method of driving a write data value to a multi-level variable resistive memory device, the method comprising:

reading resistance of reference cells;

applying a write current to a variable resistive memory cell to change an actual resistance of the variable resistive memory cell;

verifying whether the actual resistance resides in an intended resistance window associated with the write data value and generating verification results, the resistance of the reference cells, wherein the resistance window is defined in relation to a first reference resistance and a second reference resistance;

varying the amount of the write current in accordance with the verification results, and then re-applying the varied write current to the variable resistive memory cell and iteratively applying the write current, verifying of the actual resistance, and varying the amount of write current and reapplication of the varied write current until the verification results indicate that the actual resistance resides in the intended resistance window as defined by the first and second reference resistances, wherein a magnitude of change for the varying of the amount of write current gradually decreases over a number of iterations.

2. The method of claim 1, wherein the amount of write current is increased when the actual resistance is less than the first reference resistance as indicated by the verification results.

3. The method of claim 2, wherein increasing the amount of write current comprises increasing an amplitude of the write current.

4. The method of claim 2, wherein increasing the amount of write current comprises increasing a pulse width of the write current.

5. The method of claim 1, wherein the amount of write current is decreased when the actual resistance is greater than the second reference resistance as indicated by the verification results.

6. The method of claim 5, wherein decreasing the amount of write current comprises decreasing an amplitude of the write current.

7. The method of claim 5, wherein decreasing the amount of write current comprises decreasing a pulse width of the write current.

8. The method of claim 1, wherein the number of iterations is stopped when the verification results indicate that the actual resistance resides in the intended resistance window.

9. A multi-level variable resistive memory device, comprising:

a memory cell array including a variable resistive memory cell;

a temperature compensation circuit comprising one or more reference cells and reading resistance of the reference cells;

a sense amplifier verifying whether the actual resistance of the variable resistive memory cell resides in an intended resistance window and generating verification results, the intended resistance window depending on the resistance of the reference cells;

a write control circuit supplying a control signal to increase or decrease the amount of write current applied to the variable resistive memory cell on the basis of the verification results; and a write driver supplying the write current to the variable resistive memory cell, and increasing or decreasing the amount of the write current in response to the control signal, wherein the temperature compensation circuit includes a reference write driver supplying a write current to the reference cell to determine the resistance distribution of the reference cell and a reference read circuit supplying the read current to the reference cell to read the resistance distribution of the reference cell, and wherein the write driver supplies the write current to the variable resistive memory cell through a series of write loops, and the increased or decreased amount of the write current gradually decreases over the series of write loops'.

10. The device of claim 9, wherein the memory cell array including m bit-level cells ("m" is a natural number), and the reference cells have one distribution among $2^m-1$ resistance distributions.

11. The device of claim 9, wherein the reference write driver is a replica circuit of the write driver and the reference read circuit is a replica circuit of a read circuit associated with the variable resistive memory cell.

12. The multi-level variable resistive memory device of claim 11, wherein the verification sense amplifier comprises:
   a first sense amplifier sensing the actual resistance of the variable resistive memory cell using a first reference voltage corresponding to a first reference resistance; and
   a second sense amplifier sensing the actual resistance of the variable resistive memory cell using a second reference voltage corresponding to a second reference resistance.

13. The device of claim 9, wherein a memory cell array is a data storage region of a storage class memory.

14. The multi-level variable resistive memory device of claim 9, wherein the write driver discontinues supply of the write current to the variable resistive memory cell when the actual resistance resides in the intended resistance window as indicated by the verification results.

15. A memory system comprising:
   a multi-level variable resistive memory device; and
   a memory controller accessing the variable resistive memory device in response to an external command,
wherein the variable resistance memory device comprises:
   a memory cell array including a variable resistive memory cell;
   a temperature compensation circuit comprising one or more reference cells and reading resistance of the reference cells;
   a verification sense amplifier verifying whether the actual resistance of the variable resistive memory cell resides in an intended resistance window and generating verification results, by applying a read current to the variable resistive memory cell responsive to the resistance of the reference cells, wherein the resistance window is defined in relation to a first reference resistance and a second reference resistance;
   a write control circuit supplying a control signal to increase or decrease the amount of write current applied to the variable resistive memory cell on the basis of the verification results; and
   a write driver supplying the write current to the variable resistive memory cell, and increasing or decreasing the amount of the write current in response to the control signal
wherein the variable resistance memory device iteratively applies the write current, verifies of the actual resistance, and varies the amount of write current and reapplication of the varied write current until the verification results indicate that the actual resistance resides in the intended resistance window as defined by the first and second reference resistances, and
wherein a magnitude of change for the varying of the amount of write current gradually decreases over a number of iterations.

* * * * *